(12) United States Patent
Kim et al.

(10) Patent No.: US 11,133,361 B2
(45) Date of Patent: *Sep. 28, 2021

(54) ORGANIC LIGHT-EMITTING DISPLAY APPARATUS COMPRISING SELF-ASSEMBLED LAYER CONTAINING FLUORINE

(71) Applicant: Samsung Display Co., Ltd., Yongin-si (KR)

(72) Inventors: Jaesik Kim, Yongin-si (KR); Yeonhwa Lee, Yongin-si (KR); Joongu Lee, Yongin-si (KR); Sehoon Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/852,291

(22) Filed: Apr. 17, 2020

(65) Prior Publication Data

US 2020/0243624 A1   Jul. 30, 2020

Related U.S. Application Data

(63) Continuation of application No. 15/907,430, filed on Feb. 28, 2018, now Pat. No. 10,658,438.

(30) Foreign Application Priority Data

Mar. 13, 2017   (KR) .................. 10-2017-0030982

(51) Int. Cl.
*H01L 51/56*   (2006.01)
*H01L 27/32*   (2006.01)
(Continued)

(52) U.S. Cl.
CPC ...... *H01L 27/3246* (2013.01); *H01L 51/0016* (2013.01); *H01L 51/0023* (2013.01);
(Continued)

(58) Field of Classification Search
CPC .................................... H01L 51/0016
See application file for complete search history.

(56) References Cited

U.S. PATENT DOCUMENTS 6,610,552 B2   8/2003   Fujimori et al.
9,054,341 B2   6/2015   Kim et al.
(Continued)

FOREIGN PATENT DOCUMENTS

JP   2002-170669 A   6/2002
JP   2002-237383 A   8/2002
(Continued)

OTHER PUBLICATIONS

Extended European search report issued by the European Patent Office dated Jul. 12, 2018 in the examination of the European Patent Application No. 18 161 103.9.

*Primary Examiner* — Daniel Whalen
(74) *Attorney, Agent, or Firm* — Lewis Roca Rothgerber Christie LLP

(57) ABSTRACT

An organic light-emitting display apparatus including a substrate, a first first electrode on the substrate, a first organic functional layer on the first first electrode, the first organic functional layer including a first emission layer, a first second electrode on the first organic functional layer, a second first electrode on the substrate, the second first electrode being spaced apart from the first first electrode, a second organic functional layer on the second first electrode, the second organic functional layer including a second emission layer, a second second electrode on the second organic functional layer, and a self-assembled layer between
(Continued)

the first organic functional layer and the second organic functional layer, the self-assembled layer containing fluorine.

10 Claims, 40 Drawing Sheets

(51) Int. Cl.
  *H01L 51/00* (2006.01)
  *H01L 51/52* (2006.01)
(52) U.S. Cl.
  CPC .......... *H01L 51/56* (2013.01); *H01L 51/5206* (2013.01); *H01L 51/5221* (2013.01); *H01L 2227/323* (2013.01); *H01L 2251/305* (2013.01); *H01L 2251/308* (2013.01)

(56) References Cited

U.S. PATENT DOCUMENTS

| 10,658,438 | B2 * | 5/2020 | Kim .................... H01L 27/3246 |
| 2008/0268280 | A1 | 10/2008 | Cho et al. |
| 2010/0289019 | A1 | 11/2010 | Katz et al. |
| 2011/0156079 | A1 | 6/2011 | Nakatani et al. |
| 2016/0020424 | A1 | 1/2016 | Kim et al. |
| 2017/0025610 | A1 * | 1/2017 | Kwon ................. H01L 51/5228 |
| 2017/0133443 | A1 | 5/2017 | Nendai |

FOREIGN PATENT DOCUMENTS

| JP | WO2010/100922 A1 | 9/2010 |
| KR | 10-0841170 B1 | 6/2008 |
| KR | 10-2010-0065769 A | 6/2010 |
| KR | 10-2014-0082089 A | 7/2014 |

\* cited by examiner

ORGANIC LIGHT-EMITTING DISPLAY APPARATUS COMPRISING SELF-ASSEMBLED LAYER CONTAINING FLUORINE

CROSS-REFERENCE TO RELATED APPLICATIONS

This application is a continuation application of U.S. patent application Ser. No. 15/907,430, filed on Feb. 28, 2018, which claims priority to and the benefit of Korean Patent Application No. 10-2017-0030982, filed on Mar. 13, 2017, in the Korean Intellectual Property Office, and entitled: "Organic Light-Emitting Display Apparatus and Method of Manufacturing the Same," the entire contents of both of which are incorporated herein by reference.

BACKGROUND

1. Field

One or more embodiments relate to an organic light-emitting display apparatus and a method of manufacturing the organic light-emitting display apparatus.

2. Description of the Related Art

An organic light-emitting display apparatus is a self-emitting display apparatus that includes a hole injection electrode, an electron injection electrode, and an organic emission layer formed between the hole injection electrode and the electron injection electrode; and emits light when holes injected from the hole injection electrode and electrons injected from the electron injection electrode recombine in the organic emission layer. The organic light-emitting display apparatus has advantages such as low power consumption, high luminance, and fast response, and thus has received attention as a next-generation display apparatus.

SUMMARY

Embodiments are directed to an organic light-emitting display apparatus including a substrate, a first first electrode on the substrate, a first organic functional layer on the first first electrode, the first organic functional layer including a first emission layer, a first second electrode on the first organic functional layer, a second first electrode on the substrate, the second first electrode being spaced apart from the first first electrode, a second organic functional layer on the second first electrode, the second organic functional layer including a second emission layer, a second second electrode on the second organic functional layer, and a self-assembled layer between the first organic functional layer and the second organic functional layer, the self-assembled layer containing fluorine.

A color of light emitted from the first emission layer may be different from a color of light emitted from the second emission layer.

Each of the first organic functional layer and the second organic functional layer may further include at least one of a hole injection layer, a hole transport layer, an electron transport layer, and an electron injection layer.

The organic light-emitting display apparatus may further include a pixel-defining layer including an insulating layer and covering an edge of the first first electrode and an edge of the second first electrode.

An edge portion of the first organic functional layer and an edge portion of the second organic functional layer may be on an inclined surface of the pixel-defining layer.

The self-assembled layer may be on the pixel-defining layer and may surround the first organic functional layer and the second organic functional layer.

The self-assembled layer may be spaced apart from end portions of the first organic functional layer and the second organic functional layer by a preset gap.

The self-assembled layer may be under the pixel-defining layer and may surround peripheries of the first first electrode and the second first electrode.

The self-assembled layer may overlap end portions of the first first electrode and the second first electrode.

The self-assembled layer may include a fluorocarbon group ($-CF_3$).

The first first electrode and the second first electrode may include a conductive oxide.

The first first electrode and the second first electrode may include at least one of indium tin oxide, indium zinc oxide, zinc oxide, indium oxide, indium gallium oxide, and aluminum zinc oxide.

The organic light-emitting display apparatus may further include a common electrode integrally formed on the first second electrode and the second second electrode.

Embodiments are also directed to a method of manufacturing an organic light-emitting display apparatus including forming a first first electrode and a second first electrode on a substrate so as to be spaced apart from each other, forming a self-assembled layer containing fluorine on the first first electrode and the second first electrode, sequentially forming a first lift-off layer and a first photoresist on the self-assembled layer, removing a portion of the first lift-off layer and a portion of the first photoresist in an area corresponding to the first first electrode and allowing the self-assembled layer to remain, removing a portion of the self-assembled layer on the first first electrode by performing first plasma heat treatment, and sequentially forming, on the first first electrode, a first organic functional layer and a first second electrode, wherein the first organic functional layer includes a first emission layer, and lifting off a remaining portion of the first lift-off layer.

The first lift-off layer may have a fluorine content ranging from 20 wt % to 60 wt %.

The first organic functional layer and the first second electrode may be formed by a deposition process.

Removing the portion of the first photoresist may include performing a photolithography process.

The first lift-off layer may be etched and removed by using a first solvent containing fluorine.

The self-assembled layer may be formed by a vapor deposition method.

The self-assembled layer may include a hydrolyzable reactive group and a fluorine-containing functional group.

The method may further include sequentially forming a second lift-off layer and a second photoresist after lifting off the remaining portion of the first lift-off layer, removing a portion of the second lift-off layer and a portion of the second photoresist in an area corresponding to the second first electrode and allowing the self-assembled layer to remain removing a portion of the self-assembled layer on the second first electrode by performing second plasma heat treatment, sequentially forming a second organic functional layer and the second second electrode on the second first electrode, wherein the second organic functional layer includes a second emission layer, and lifting off a remaining portion of the second lift-off layer.

The method may further include forming, between the first first electrode and the second first electrode, a pixel-defining layer including an insulating layer.

The self-assembled layer may be formed on the pixel-defining layer.

The self-assembled layer may be formed under the pixel-defining layer.

The method may further include forming a common electrode in an integral form on the first second electrode and the second second electrode.

Embodiments are also directed to a method of manufacturing an organic light-emitting display apparatus, including forming a first first electrode and a second first electrode on a substrate so as to be spaced apart from each other, forming a first self-assembled layer on the first first electrode and the second first electrode, forming a first photoresist on the first self-assembled layer, removing a portion of the first photoresist in an area corresponding to the first first electrode and allowing the first self-assembled layer to remain, removing a portion of the first self-assembled layer on the first first electrode by performing first plasma heat treatment, and sequentially forming a first organic functional layer and a first second electrode on the first first electrode. The first organic functional layer includes a first emission layer, and lifting off a remaining portion of the first photoresist and a remaining portion of the first self-assembled layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
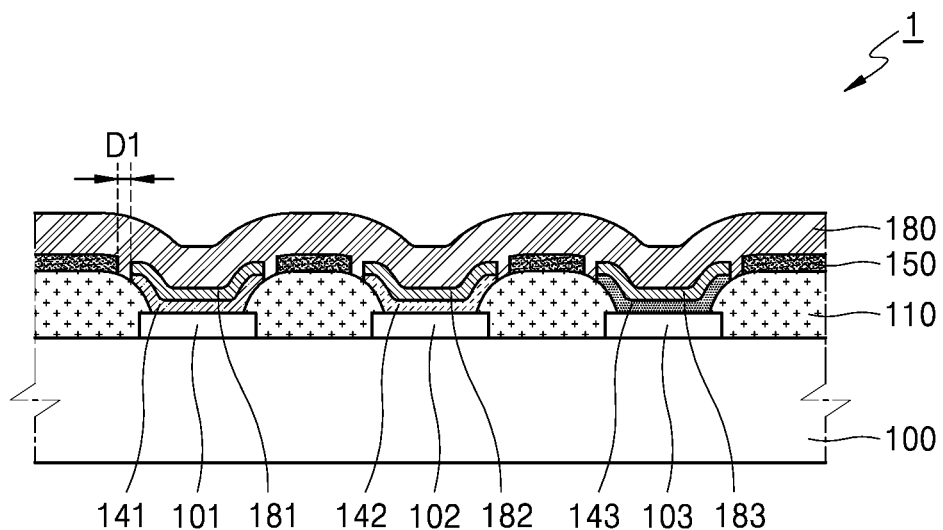
FIG. 1 illustrates a cross-sectional view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In this regard, unless otherwise provided, a description that a layer or element is "under" another layer or element may be interpreted as indicating that the layer or element is closer to the substrate than the other layer or element. In addition, it will also be understood that when a layer is referred to as being "between" two layers, it can be the only layer between the two layers, or one or more intervening layers may also be present. Like reference numerals refer to like elements throughout.

Figure 2:
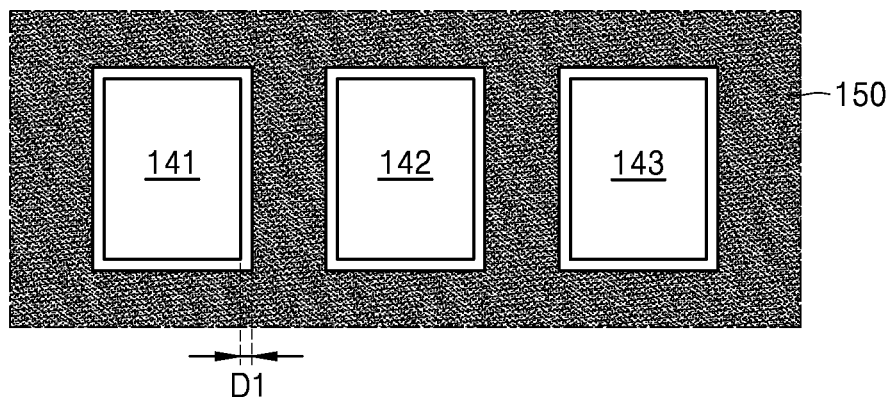
FIG. 2 illustrates a plan view of a portion of the organic light-emitting display apparatus according to the embodiment illustrated in FIG. 1.

FIG. 1 illustrates a cross-sectional view of an organic light-emitting display apparatus 1 according to a an embodiment, and FIG. 2 illustrates a plan view of a portion of the organic light-emitting display apparatus 1 according to the embodiment.

Referring to FIGS. 1 and 2, in the organic light-emitting display apparatus 1, a plurality of anodes including a first anode 101, a second anode 102, and a third anode 103 may be on a substrate 100 in a spaced apart relationship each other.

First to third organic functional layers 141, 142, and 143 including first to third emission layers may be respectively located on the first to third anodes 101, 102, and 103. First to third auxiliary cathodes 181, 182, and 183 including a conductive material may be respectively located on the first to third organic functional layers 141, 142, and 143. An integrally formed common electrode 180 may be located on the first to third auxiliary cathodes 181, 182, and 183. (The first auxiliary cathode 181, the second auxiliary cathode 182, and the third auxiliary cathode 183 may also be referred to as a first second electrode, a second second electrode and a third second electrode, so as to not be limited as to polarity. For example, in some implementations, electrodes 101,102, and 103 may be cathodes, and electrodes 180, 181, 182, and 183 may be anodes.)

A pixel-defining layer 110 including an insulating material may cover end portions of the first to third anodes 101, 102, and 103. The pixel-defining layer 110 may prevent electric field concentration at each of the end portions of the first to third anodes 101, 102, and 103.

A self-assembled monolayer 150 may be located on the pixel-defining layer 110. The self-assembled monolayer 150 may surround the first to third organic functional layers 141, 142 and 143. The self-assembled monolayer 150 may be spaced apart from the end portions of the first to third organic functional layers 141, 142, 413 by a predetermined distance D1.

The self-assembled monolayer 150 may include a fluorine-containing functional group and a hydrolyzable reactive group.

The fluorine-containing functional group may include fluorocarbon ($CF_3$). The hydrolyzable reactive group may include a silicone compound. For example, the self-assembled monolayer 150 may include FOTS (1H,1H,2H,2H-perfluorodecyltrichlorosilane-perfluoro), FDTS (heptadecafluoro-1,1,2,2-tetrahydrodecyl)trichlorosilane), FOMMS $(CF_3(CF_2)_5(CH_2)_2Si(CH_3)_2Cl)$, FOMDS $(CF_3(CF_2)_5(CH_2)_2Si(CH_3)Cl_2)$, FOTES $(CF_3(CF_2)_5(CH_2)_2Si(OC_2H_5)_3)$, or the like.

The self-assembled monolayer may include a hydrophobic functional group containing a methyl group (—CH). For example, the self-assembled monolayer may include octadecyltrichlorosilane (OTS), dichlorodimethylsilane (DDMS), or the like.

The fluorine-containing functional group may be located at a greater distance from the surfaces of the first to third anodes 101, 102, and 103 and the pixel-defining layer 110 than the hydrolyzable reactive group. The fluorine-containing functional group of the self-assembled monolayer 150 may have a small difference in surface energy with respect to a lift-off layer 121 (see FIG. 5A) containing fluorine, to be described below. Thus, the lift-off layer 121 may be uniformly formed on the self-assembled monolayer 150, thereby improving patterning precision. In addition, the term "monolayer" used in the self-assembled monolayer is not limited as meaning that the self-assembled monolayer includes a single molecule. Herein, instead of the term "self-assembled monolayer", the term "self-assembled layer" may be used as having the same meaning as the term "self-assembled monolayer".

With reference to FIGS. 3 to 7F, a method of manufacturing the organic light-emitting display apparatus 1 and the organic light-emitting display apparatus 1 manufactured by the above method are described in more detail.

Figure 3:
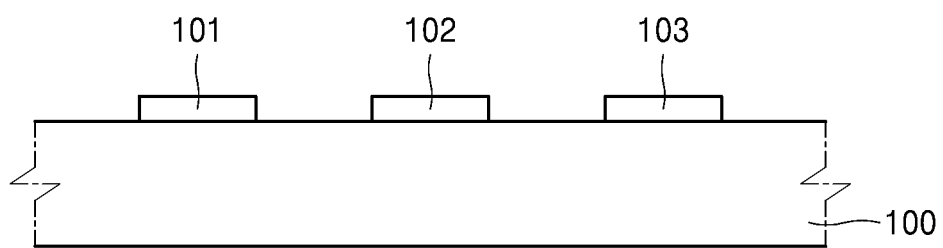
FIG. 3 illustrates a cross-sectional view for explaining forming a plurality of anodes on a substrate of the organic light-emitting display apparatus according to the embodiment illustrated in FIG. 1.
Figure 4:
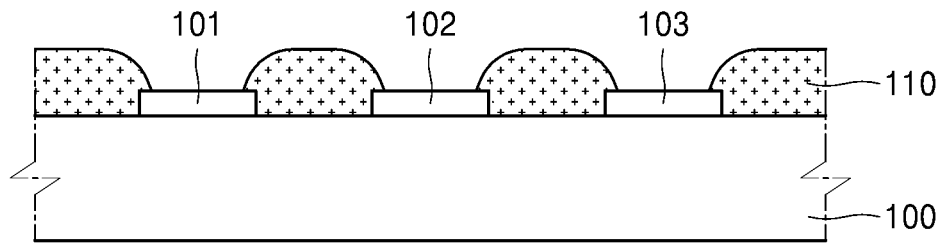
FIG. 4 illustrates a cross-sectional view for explaining forming a pixel-defining layer in the organic light-emitting display apparatus according to the embodiment illustrated in FIG. 1.

FIG. 3 illustrates a cross-sectional view for explaining forming the first to third anodes 101, 102, and 103 on the substrate 100 of the organic light-emitting display apparatus 1. FIG. 4 illustrates a cross-sectional view for explaining forming the pixel-defining layer 110 in the organic light-emitting display apparatus 1. FIGS. 5A to 5F illustrates cross-sectional views for explaining a first unit process of forming the organic light-emitting display apparatus 1. FIGS. 6A to 6F illustrate cross-sectional views for explaining a second unit process of the organic light-emitting display apparatus 1. FIGS. 7A to 7F illustrate cross-sectional views for explaining a third unit process of the organic light-emitting display apparatus 1.

Referring to FIG. 3, a plurality of anodes including the first anode 101, the second anode 102, and the third anode 103 may be formed on the substrate 100. (The first anode 101, the second anode 102, and the third anode 103 may also be referred to as a first first electrode, a second first electrode and a third first electrode, so as to not be limited as to polarity.)

The substrate 100 may include suitable materials. For example, the substrate 100 may include glass or plastic. Examples of the plastic may include materials having excellent heat resistance and excellent durability, such as polyimide, polyethylenenaphthalate, polyethyleneterephthalate, polyarylate, polycarbonate, polyetherimide, and polyethersulfone.

A buffer layer for flattening a top surface of the substrate 100 and preventing penetration of impurities may be further formed on the substrate 100. For example, the buffer layer may be a single layer or a plurality of layers including silicon nitride, silicon oxide, and/or the like.

The first to third anodes 101, 102, and 103 may be hole injection electrodes and may include materials having a high work function. The first to third anodes 101, 102, and 103 may each include a transparent conductive oxide component. For example, the first to third anodes 101, 102, and 103 may include at least one selected from indium tin oxide, indium zinc oxide, zinc oxide, indium oxide, indium gallium oxide, and aluminum zinc oxide. The first to third anodes 101, 102, and 103 may each be a single layer or may be a plurality of layers including a metal and/or an alloy such as silver (Ag), aluminum (Al), magnesium (Mg), lithium (Li), or calcium (Ca).

The first to third anodes 101, 102, and 103 may electrically contact first to third thin-film transistors, respectively, that are located between the substrate 100 and the first to third anodes 101, 102, and 103.

Referring to FIG. 4, the pixel-defining layer 110 surrounding edges of the first anode 101, the second anode 102, and the third anode 103 may be formed on the substrate 100.

End portions of the first to third anodes 101, 102, and 103 may be sharp. Accordingly, when a current is applied after the first to third auxiliary cathodes 181, 182, and 183 are formed, there is a possibility that an electric field could concentrate on the end portions of the first to third anodes 101, 102, and 103, and thus an electrical short circuit could occur during operation. However, when the end portions of the first to third anodes 101, 102, and 103 are covered by the pixel-defining layer 110, as illustrated in FIGS. 1 and 4, an electric field may be prevented from concentrating at the end portions of the first to third anodes 101, 102, and 103.

The pixel-defining layer 110 may be an organic insulating layer including, for example, a general-purpose polymer such as poly(methyl methacrylate) (PMMA) or polystyrene (PS), a polymer derivative having a phenol group, an acryl-based polymer, an imide-based polymer, an aryletherbased polymer, an amide-based polymer, a fluorine-based polymer, a p-xylene-based polymer, a vinyl alcohol-based polymer, or a blend thereof.

Figure 5A:
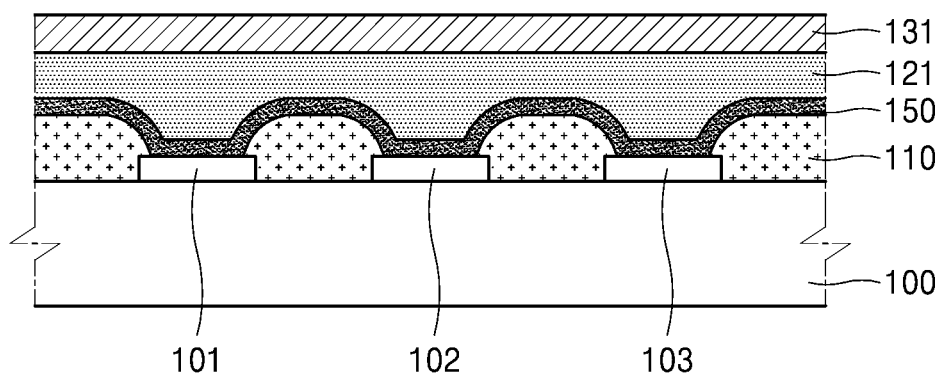
FIGS. 5A to 5F illustrate cross-sectional views for explaining stages of a first unit process of forming the organic light-emitting display apparatus according to the embodiment illustrated in FIG. 1.

Referring to FIG. 5A, a self-assembled monolayer 150, a first lift-off layer 121, and a first photoresist 131 are sequentially formed on the substrate 100 on which the first to third anodes 101, 102, and 103 are formed.

The self-assembled monolayer 150 may be formed by using a coating method, a printing method, a deposition method, or the like. The self-assembled monolayer 150 may include a fluorine-containing functional group and a hydrolyzable reactive group, as described above. For example, as described above, the self-assembled monolayer 150 may includes FOTS (1H,1K2H,2H-perfluorodecyltrichlorosilane-perfluoro), FDTS (heptadecafluoro-1,1,2,2-tetrahydrodecyl)trichlorosilane), FOMMS ($CF_3(CF_2)_5(CH_2)_2Si(CH_3)_2Cl$), FOMDS ($CF_3(CF_2)_5(CH_2)_2Si(CH_3)Cl_2$), FOTES ($CF_3(CF_2)_5(CH_2)_2Si(OC_2H_5)_3$), or the like.

The first lift-off layer 121 may include a fluoropolymer. The fluoropolymer included in the first lift-off layer 121 may include a polymer having a fluorine content ranging from about 20 wt % to about 60 wt %. For example, the fluoropolymer included in the first lift-off layer 121 may include at least one from among a copolymer of polytetrafluoroethylene, polychlorotrifluoroethylene, polydichlorodifluoroethylene, chlorotrifluoroethylene, and dichlorofluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The first lift-off layer 121 may be formed by using a coating method, a printing method, a deposition method, or the like. When the first lift-off layer 121 is formed by using a coating method or a printing method, curing and polymerization may be performed as desired, and then a process of forming a first photoresist 131 may be performed.

Figure 21:
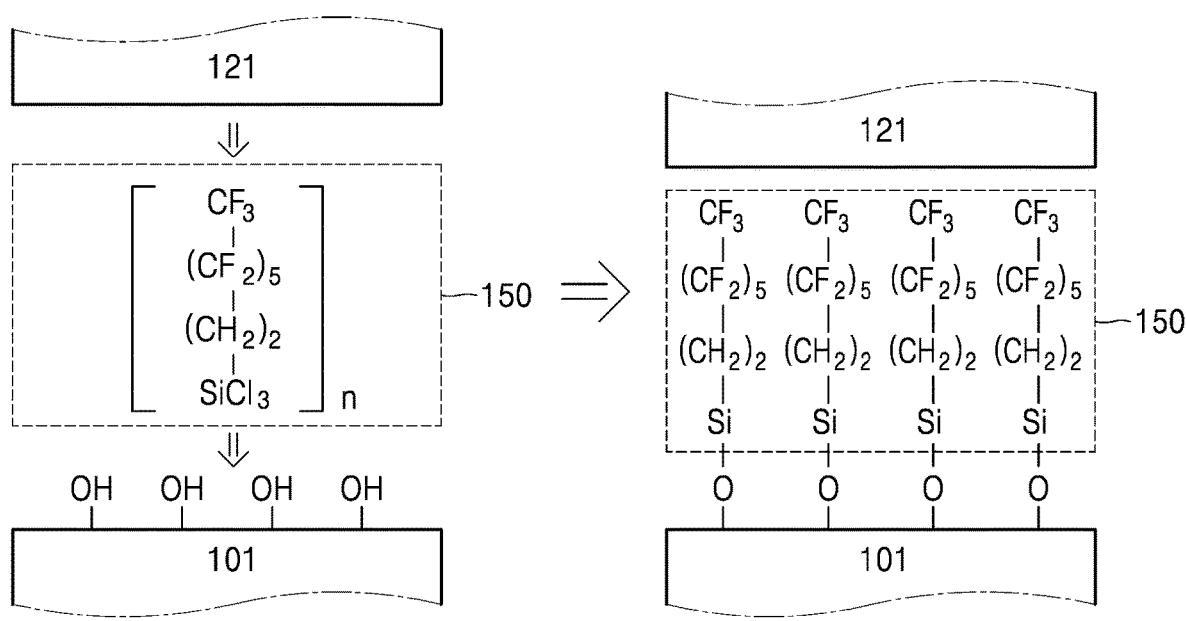
FIG. 21 illustrates a diagram illustrating an operation mechanism of a self-assembled monolayer.

FIG. 21 schematically illustrates a mechanism by which a self-assembled monolayer 150 may operate when the self-assembled monolayer 150 is formed on a first anode 101.

For example, when a self-assembled monolayer 150 including FOTS is deposited on a first anode 101 including indium tin oxide, a hydrolysis reactive group that includes silicon, of the self-assembled monolayer 150, may cause a hydrolysis and condensation reaction with a hydroxyl group (—OH) of the surface of the first anode 101. The self-assembled monolayer 150 may be covalently bonded to the surface of the first anode 101. This covalent bonding may increase adhesion between the surface of the self-assembled monolayer 150 and the surface of the first anode 101.

When a first lift-off layer 121 including a fluoropolymer is formed on the self-assembled monolayer 150, a fluorine-containing functional group of the self-assembled monolayer 150, which is in close contact with the first lift-off layer 121, may have a small difference in surface energy with respect to the lift-off layer 121. Thus, the lift-off layer 121 may be uniformly formed on the self-assembled monolayer 150.

The first photoresist 131 may be formed on the first lift-off layer 121. As illustrated in FIG. 5A, the first photoresist 131 at a position corresponding to the first anode 101 may be exposed through a first photomask M1 including an area M11 through which light L is transmitted.

Figure 5B:
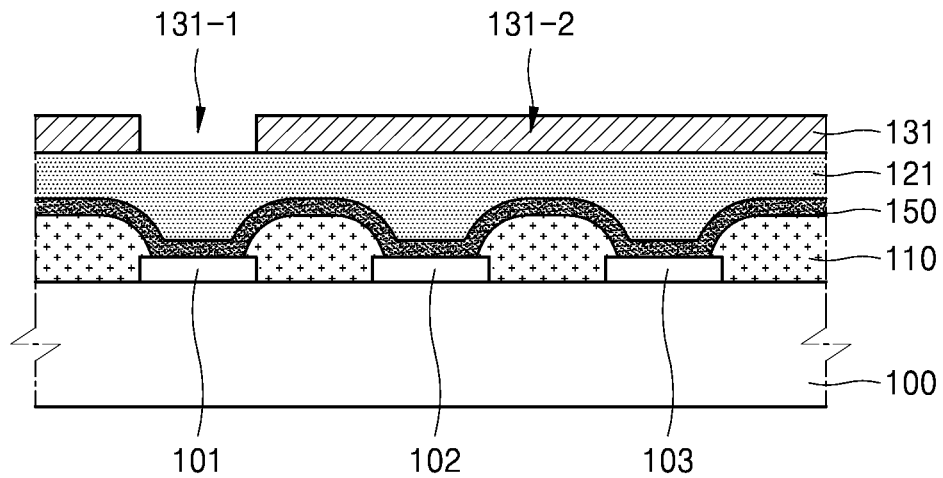

Referring to FIG. 5B, the first photoresist 131 may be developed. The first photoresist 131 may be a positive photoresist or a negative photoresist. In the present embodiment, it is assumed that the first photoresist 131 is a positive photoresist. In the first photoresist 131 that is developed, a first portion 131-1 corresponding to the first anode 101 may be removed and a second portion 131-2 other than the first portion 131-1 may remain.

Figure 5C:
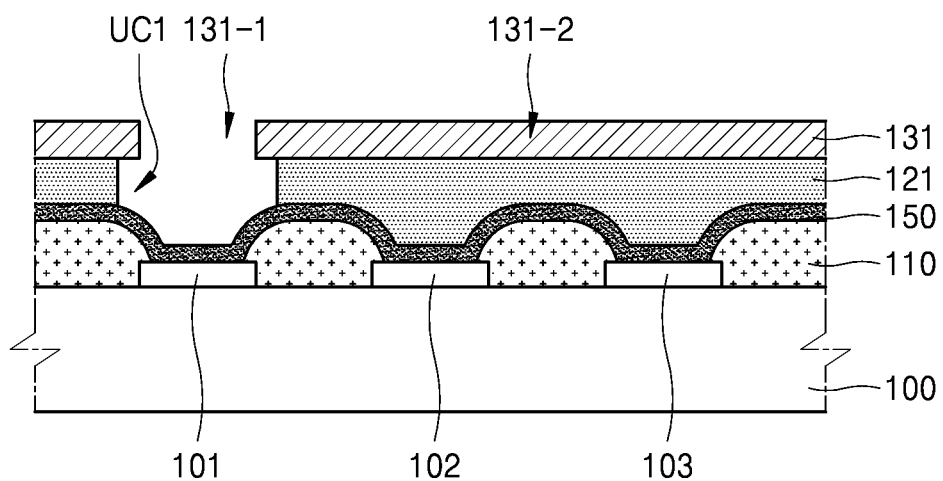

Referring to FIG. 5C, the first lift-off layer 121 may be etched by using a pattern of the first portion 131-1 of the first photoresist 131 as an etch mask.

The first lift-off layer 121 may include the fluoropolymer. Accordingly, a solvent that etches the fluoropolymer may be used as an etchant.

A first solvent including fluorine may be used as the etchant. The first solvent may include hydrofluoroether, which is a material that is electrochemically stable due to a low interaction with other materials and is environmentally stable due to a low global warming potential and a low toxicity.

A portion of the first lift-off layer 121 formed at a position corresponding to the first portion 131-1, that is, above the first anode 101, may be etched during an etching process. The first lift-off layer 121 may be etched by the first solvent including fluorine to form a first undercut profile UC1-1 under a boundary surface of the first portion 131-1 of the first photoresist 131.

The self-assembled monolayer 150 may be well bonded to the top surface of the first anode 101 while the first lift-off layer 121 is etched. For example, as described above, a hydrolysis and condensation reaction may occur between a reactive group including silicon, included in the self-assembled monolayer 150, and the surface of the first anode 101. An adhesive strength due to covalent bonding between the self-assembled monolayer 150 and the surface of the first anode 101 may be increased.

In addition, a hydrolysis and condensation reaction may occur between a reactive group including silicon, included in the self-assembled monolayer 150, and a surface material of the pixel-defining layer 110, and thus an adhesive strength between the surface of the self-assembled monolayer 150 and the surface of the pixel-defining layer 110 may be increased. The self-assembled monolayer 150 may be well bonded to the top surface of the pixel-defining layer 110 while the first lift-off layer 121 is etched.

Figure 5D:
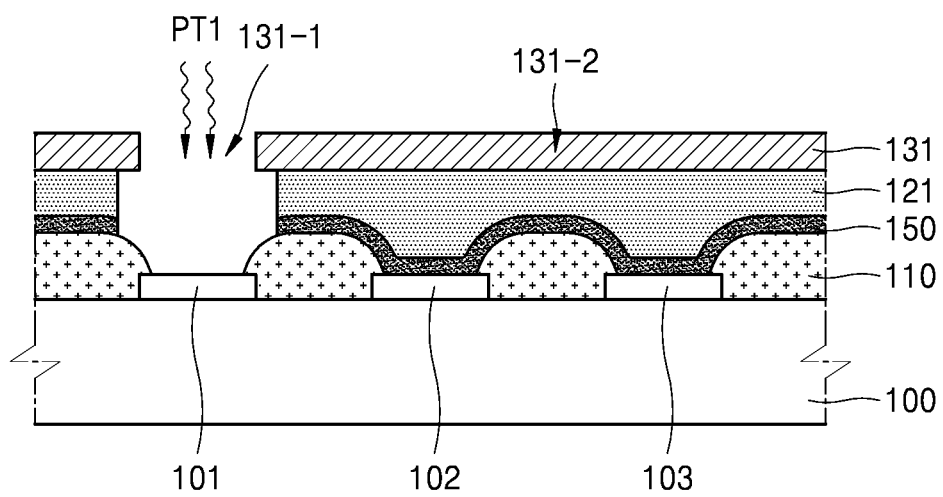

Referring to FIG. 5D, a portion of the self-assembled monolayer 150 on the first anode 101 may be removed by performing first plasma heat treatment on the structure illustrated in FIG. 5C.

The Si—O bond between the first anode 101 and the self-assembled monolayer 150 shown in FIG. 21 may be cleanly broken by the first plasma heat treatment. In this regard, if the first lift-off layer 121 were to be directly formed on the first anode 101 after the formation of the first anode 101 without forming the self-assembled monolayer 150 and were to be removed in a subsequent process, a residue of the first lift-off layer 121 could remain on the first anode 101, causing contamination. However, in the present embodiment, the self-assembled monolayer 150 may be formed between the first anode 101 and the first lift-off layer 121 to prevent a residue of the first lift-off layer 121 from remaining on the first anode 101, thereby preventing deterioration of the organic-light emitting display apparatus.

Figure 5E:
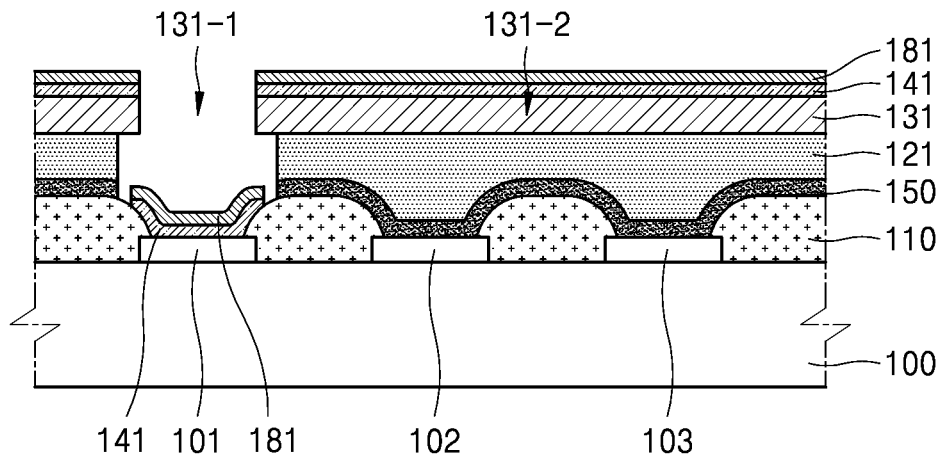

Referring to FIG. 5E, a first organic functional layer 141 including a first emission layer and a first auxiliary cathode 181 may be sequentially formed on the structure illustrated in FIG. 5D.

The first organic functional layer 141 may further include at least one selected from a hole injection layer, a hole transport layer, an electron transport layer, and an electron injection layer.

The first organic functional layer 141 may be formed by a vacuum deposition method. In the deposition process, the first lift-off layer 121 and the first photoresist 131 may function as masks. A portion of the first organic functional layer 141 may be formed at a position corresponding to the first portion 131-1, that is, above the first anode 101, and the other portion of the first organic functional layer 141 may be formed on a second portion 131-2 of the first photoresist 131.

Like the first organic functional layer 141, the first auxiliary cathode 181 may also be formed by using a vacuum deposition method. In the deposition process, the first lift-off layer 121 and the first photoresist 131 may function as masks. A portion of the first auxiliary cathode 181 may be formed to cover a top surface of the first organic functional layer 141, and the other portion of the first auxiliary cathode 181 may be formed on the first organic functional layer 141 on a second portion 131-2 of the first photoresist 131 other than the first portion 131-1.

The first auxiliary cathode 181 may include the same material as that of a cathode 180 that is a common electrode to be described below. In some implementations, the first auxiliary cathode 181 may include a material different from that of the cathode 180. The first auxiliary cathode 181 may function as a barrier for protecting the first organic functional layer 141 from a solvent used in a subsequent lift-off process.

Figure 5F:
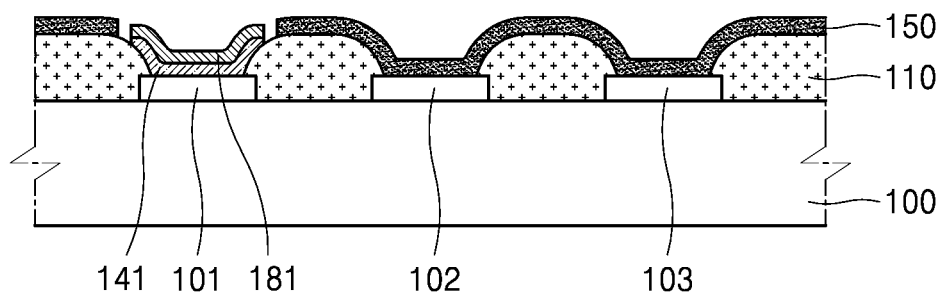

Referring to FIG. 5F, a lift-off process may be performed on the structure illustrated in FIG. 5E.

The first lift-off layer 121 may include the fluoropolymer. Accordingly, a second solvent including fluorine may be used in the lift-off process. The first organic functional layer 141 may be formed and then the lift-off process may be performed. Accordingly, the second solvent may include a material having a low reactivity with the first organic functional layer 141. Like the first solvent, the second solvent may include hydrofluoroether.

When the first lift-off layer 121 formed under the second portion 131-2 (see FIG. 5E) of the first photoresist 131 is lifted off, portions of the first organic functional layer 141 and the first auxiliary cathode 181 that were formed on the second portion 131-2 of the first photoresist 131 may be removed. Portions of the first organic functional layer 141 and the first auxiliary cathode 181 formed over the first anode 101 may remain as patterns.

The self-assembled monolayer 150 formed on the pixel-defining layer 110 is not removed. As described above, an adhesive strength between the surface of the self-assembled monolayer 150 and the surface of the pixel-defining layer 110 is high due to a hydrolysis and condensation reaction between a reactive group including silicon, included in the self-assembled monolayer 150, and a surface material of the pixel-defining layer 110. Accordingly, the self-assembled monolayer 150 may be well bonded to the top surface of the pixel-defining layer 110 while the first lift-off layer 121 is lifted off.

After the first unit process is performed, a second unit process of forming the second organic functional layer 142, which may emits light of a different color from that emitted by the first organic functional layer 141, may be performed on an area where the second anode 102 is located. The second unit process will now be described with reference to FIGS. 6A to 6F.

Figure 6A:
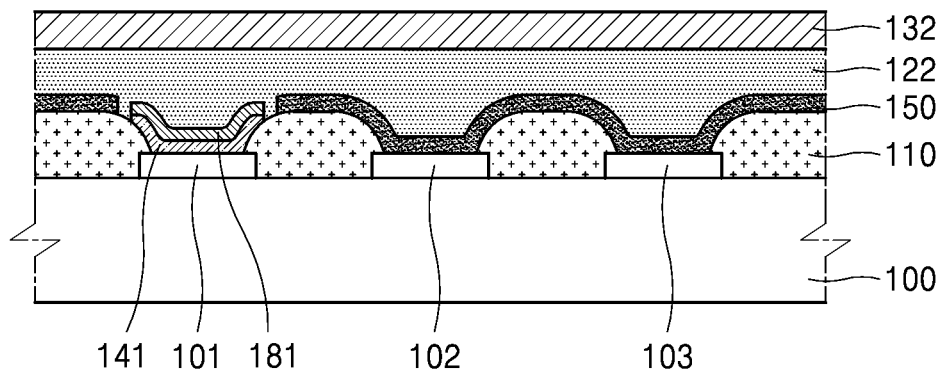
FIGS. 6A to 6F illustrate cross-sectional views for explaining stages of a second unit process of forming the organic light-emitting display apparatus according to the embodiment illustrated in FIG. 1.

Referring to FIG. 6A, a second lift-off layer 122 and a second photoresist 132 may be sequentially formed on the structure illustrated in FIG. 5F.

The second lift-off layer 122 may include a fluoropolymer. The second lift-off layer 122 may include the same material as that of the first lift-off layer 121 and may be formed by using a coating method, a printing method, or a deposition method.

The second photoresist 132 may be formed on the second lift-off layer 122. The second photoresist 132, may be exposed through a second photomask M2 including an area M21 through which light L is transmitted, the area M21 being at a position corresponding to the second anode 102.

Figure 6B:
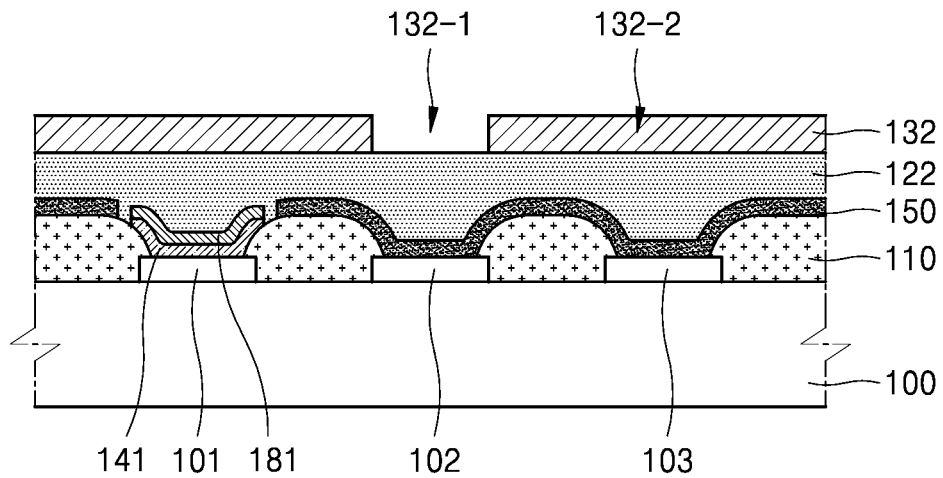

Referring to FIG. 6B, the second photoresist 132 may be developed. In the second photoresist 132, a first portion 132-1 corresponding to the second anode 102 may be removed and a second portion 132-2 other than the first portion 132-1 may remain.

Figure 6C:
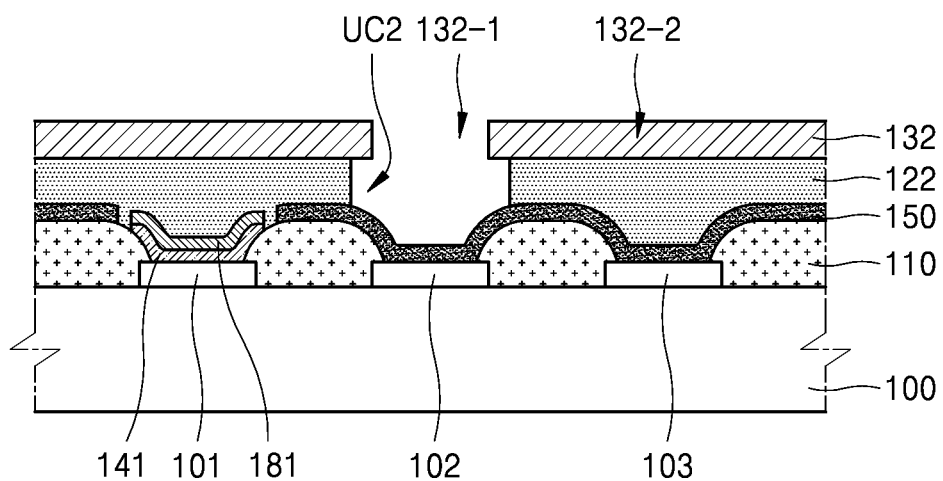

Referring to FIG. 6C, the second lift-off layer 122 may be etched by using a pattern of the first portion 132-1 of the second photoresist 132 as an etch mask.

The second lift-off layer 122 includes the fluoropolymer. Accordingly, a solvent that etches the fluoropolymer may be used as an etchant. For example, a first solvent including fluorine may be used as the etchant. The first solvent may include hydrofluoroether.

A portion of the second lift-off layer 122 formed at a position corresponding to the first portion 132-1, that is, above the second anode 102, may be etched during an etching process. The second lift-off layer 122 may be etched by the first solvent including fluorine to form a second undercut profile UC2-1 under a boundary surface of the first portion 132-1 of the second photoresist 132.

The self-assembled monolayer 150 may be well bonded to the top surface of the second anode 102 while the second lift-off layer 122 is etched. In addition, the self-assembled monolayer 150 may be well bonded to the top surface of the pixel-defining layer 110 while the second lift-off layer 122 is etched.

Figure 6D:
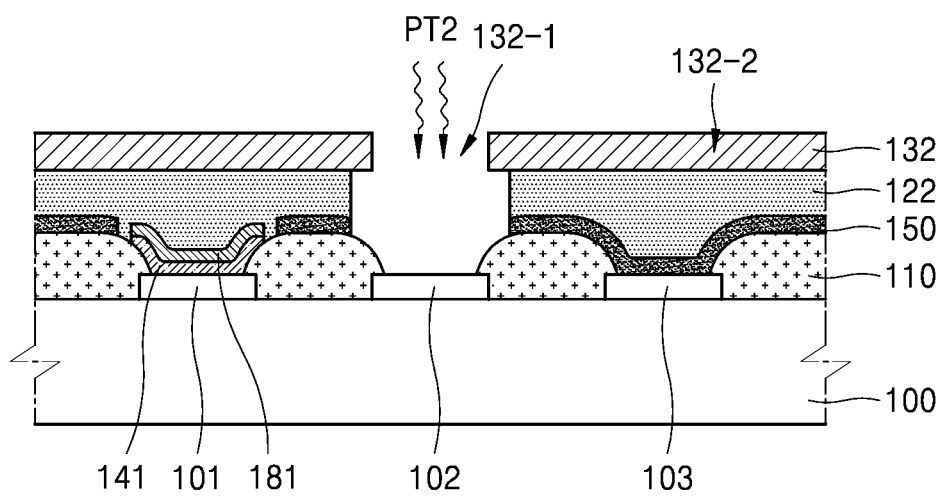

Referring to FIG. 6D, a portion of the self-assembled monolayer 150 on the second anode 102 may be removed by performing a second plasma heat treatment on the structure illustrated in FIG. 6C.

An Si—O bond between the second anode 102 and the self-assembled monolayer 150 may be cleanly broken by the second plasma heat treatment. Accordingly, a residue of the second lift-off layer 122 may not remain on the second anode 102.

Figure 6E:
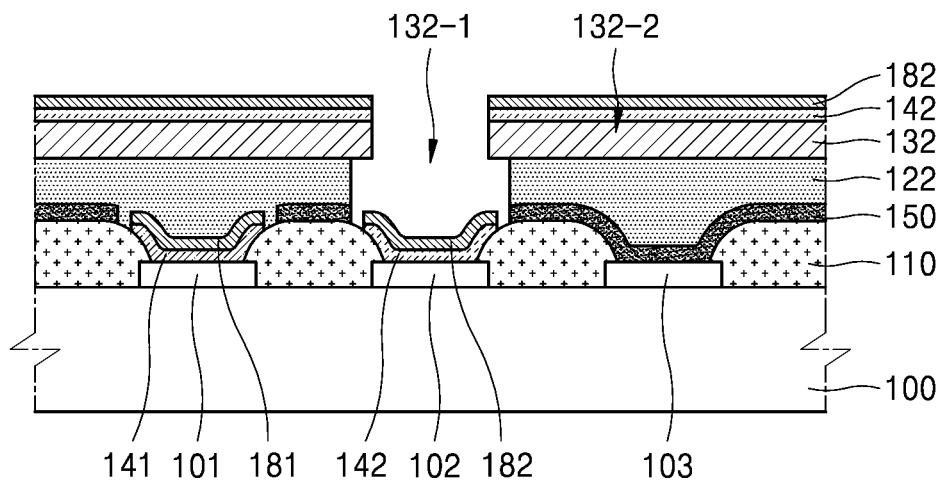

Referring to FIG. 6E, a second organic functional layer 142 including a second emission layer and a second auxiliary cathode 182 may be sequentially formed on the structure illustrated in FIG. 6D.

The second organic functional layer 142 may further include at least one selected from a hole injection layer, a hole transport layer, an electron transport layer, and an electron injection layer.

The second organic functional layer 142 may be formed by using a vacuum deposition method. In the deposition process, the second lift-off layer 122 and the second photoresist 132 may function as masks. A portion of the second organic functional layer 142 may be formed at a position corresponding to the first portion 132-1, that is, above the second anode 102, and another portion of the second organic functional layer 142 may be formed on the second portion 132-2 of the second photoresist 132.

Like the second organic functional layer 142, the second auxiliary cathode 182 may be formed by using a vacuum deposition method. In the deposition process, the second lift-off layer 122 and the second photoresist 132 may function as masks. A portion of the second auxiliary cathode 182 may be formed to cover a top surface of the second organic functional layer 142, and another portion of the second auxiliary cathode 182 may be formed on the second organic functional layer 142 on the second portion 132-2 of the second photoresist 132.

The second auxiliary cathode 182 may include the same material as that of the cathode 180 that is a common electrode to be described below. In some implementations, the second auxiliary cathode 182 may include a material different from that of the cathode 180. The second auxiliary cathode 182 may function as a barrier for protecting the second organic functional layer 142 from a solvent used in a subsequent lift-off process.

Figure 6F:
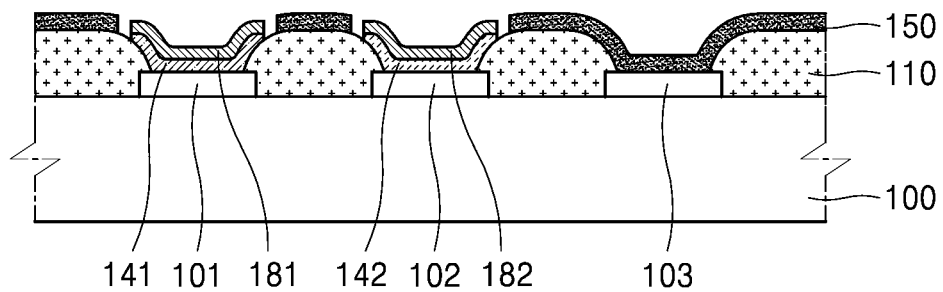

Referring to FIG. 6F, a lift-off process may be performed on the structure illustrated in FIG. 6E.

The second lift-off layer 122 includes the fluoropolymer. Accordingly, a second solvent including fluorine may be used in the lift-off process. The second organic functional layer 142 may be formed and then the lift-off process may be performed. Accordingly, the second solvent may include a material having a low reactivity with the second organic functional layer 142. Like the first solvent, the second solvent may include hydrofluoroether.

When the second lift-off layer 122 formed under the second portion 132-2 (see FIG. 6E) of the second photoresist 132 is lifted off, portions of the second organic functional layer 142 and the second auxiliary cathode 182 that were formed on the second portion 132-2 of the second photoresist 132 may be removed. Portions of the second organic functional layer 142 and the second auxiliary cathode 182 formed over the second anode 102 may remain as patterns.

As described above, an adhesive strength between the self-assembled monolayer 150 and the pixel-defining layer 110 may be sufficient such that the self-assembled monolayer 150 formed on the pixel-defining layer 110 is not removed when the second lift-off layer 122 is lifted off.

After the second unit process is performed, a third unit process of forming the third organic functional layer 143, which may emit light of a different color from that emitted by the first organic functional layer 141 and the second organic functional layer 142 may be performed on an area where the third anode 103 is located. The third unit process will now be described with reference to FIGS. 7A to 7F.

Figure 7A:
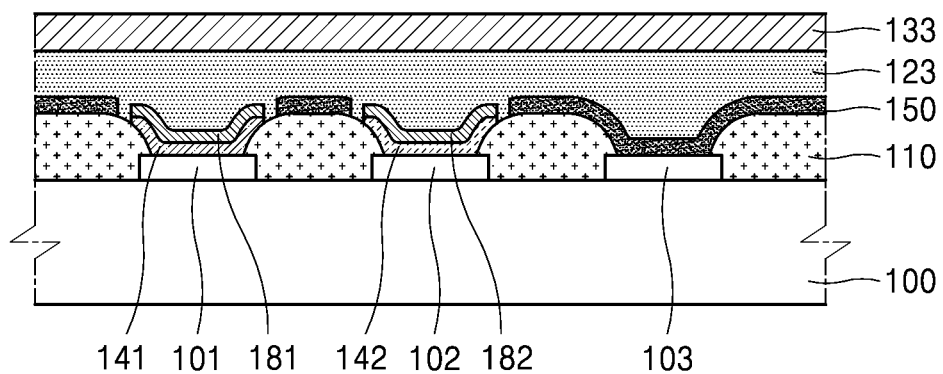
FIGS. 7A to 7F illustrate cross-sectional views for explaining stages a third unit process of forming the organic light-emitting display apparatus according to the embodiment illustrated in FIG. 1.

Referring to FIG. 7A, a third lift-off layer 123 and a third photoresist 133 may be sequentially formed the structure illustrated in FIG. 6F.

The third lift-off layer 123 may include a fluoropolymer. The third lift-off layer 123 may include the same material as that of the first and second lift-off layers 121 and 122 and may be formed by using a coating method, a printing method, or a deposition method.

The third photoresist 133 may be formed on the third lift-off layer 123. The third photoresist 133 at a position corresponding to the third anode 103 may be exposed through a third photomask M3 including an area M31 through which light L is transmitted.

Figure 7B:
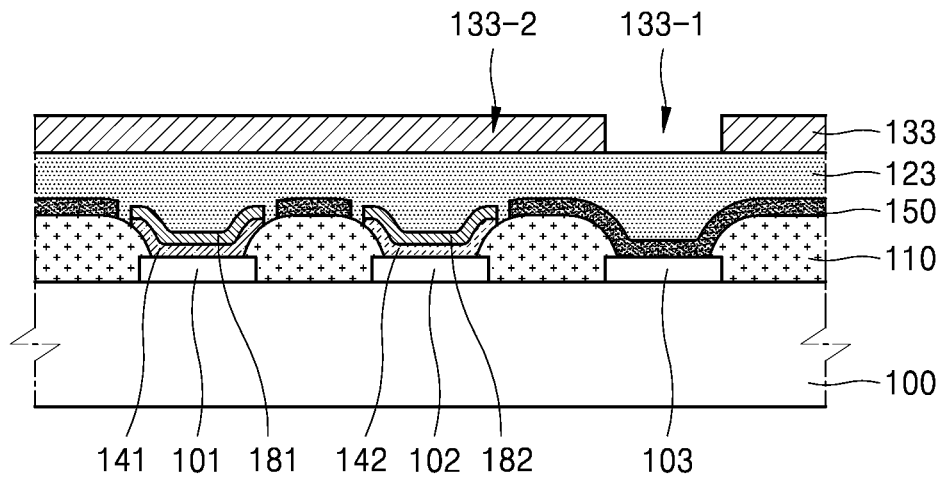

Referring to FIG. 7B, the third photoresist 133 may be developed. In the third photoresist 133, a first portion 133-1 corresponding to the third anode 103 may be removed and a second portion 133-2 other than the first portion 133-1 may remain.

Figure 7C:
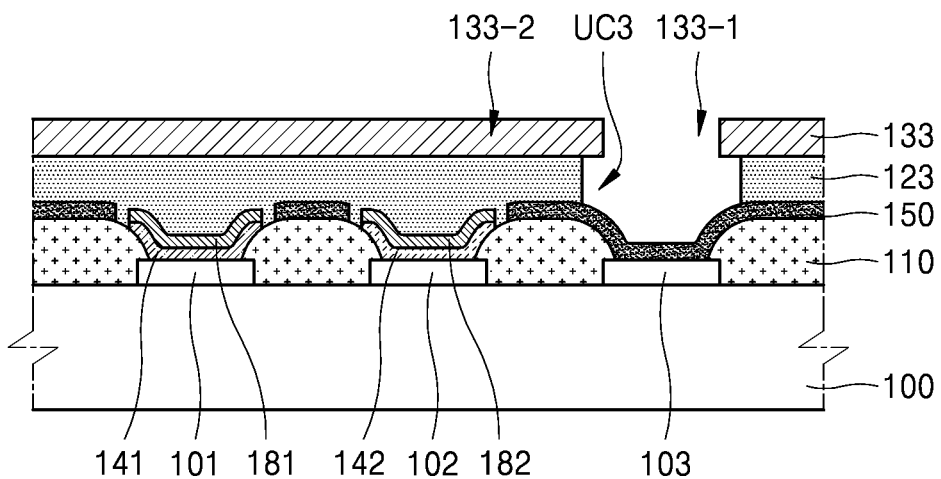

Referring to FIG. 7C, the third lift-off layer 123 may be etched by using a pattern of the first portion 133-1 of the third photoresist 133 as an etch mask.

The third lift-off layer 123 may include the fluoropolymer. Accordingly, a solvent that etches the fluoropolymer may be used as an etchant. For example, a first solvent including fluorine may be used as the etchant. The first solvent may include hydrofluoroether.

A portion of the third lift-off layer 123 formed at a position corresponding to the first portion 133-1, that is, above the third anode 103, may be etched during an etching process. The third lift-off layer 123 may be etched by the first solvent including fluorine to form a third undercut profile UC3-1 under a boundary surface of the first portion 133-1 of the third photoresist 133.

The self-assembled monolayer 150 may be well bonded to the top surface of the third anode 103 while the third lift-off layer 123 is etched. In addition, the self-assembled monolayer 150 may be well bonded to the top surface of the pixel-defining layer 110 while the third lift-off layer 123 is etched.

Figure 7D:
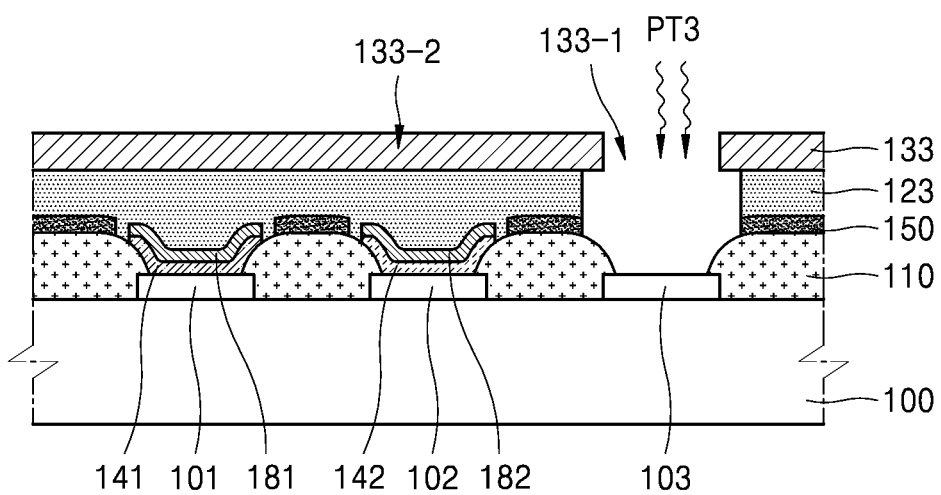

Referring to FIG. 7D, a portion of the self-assembled monolayer 150 on the third anode 103 may be removed by performing third plasma heat treatment on the structure illustrated in FIG. 7C.

An Si—O bond between the third anode 103 and the self-assembled monolayer 150 may be cleanly broken by the third plasma heat treatment. Accordingly, a residue of the third lift-off layer 123 may not remain on the third anode 103.

Figure 7E:
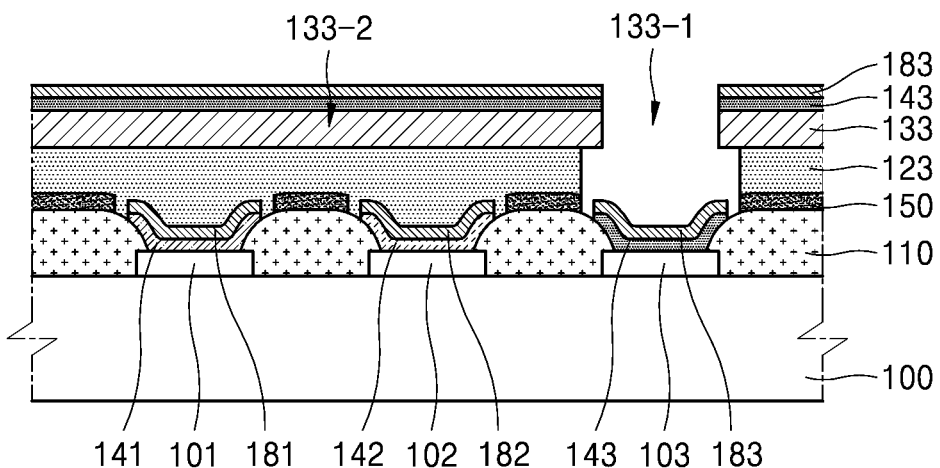

Referring to FIG. 7E, a third organic functional layer 143 including a third emission layer and a third auxiliary cathode 183 may be sequentially formed on the structure illustrated in FIG. 7D.

The third organic functional layer 143 may further include at least one selected from a hole injection layer, a hole transport layer, an electron transport layer, and an electron injection layer.

The third organic functional layer 143 may be formed by using a vacuum deposition method. In the deposition process, the third lift-off layer 123 and the third photoresist 133 may function as masks. A portion of the third organic functional layer 143 is formed at a position corresponding to the first portion 133-1, that is, above the third anode 103, and another portion of the third organic functional layer 143 may be formed on the second portion 133-2 of the third photoresist 133.

Like the third organic functional layer 143, the third auxiliary cathode 183 may be formed by using a vacuum deposition method. In the deposition process, the third lift-off layer 123 and the third photoresist 133 may function as masks. A portion of the third auxiliary cathode 183 may be formed to cover a top surface of the third organic functional layer 143, and another portion of the third auxiliary cathode 183 may be formed on the third organic functional layer 143 on the second portion 133-2 of the third photoresist 133.

The third auxiliary cathode 183 may include the same material as that of the cathode 180 that is a common electrode to be described below. In some implementations, the third auxiliary cathode 183 may include a material different from that of the cathode 180. The third auxiliary cathode 183 may function as a barrier for protecting the third organic functional layer 143 from a solvent used in a subsequent lift-off process.

Figure 7F:
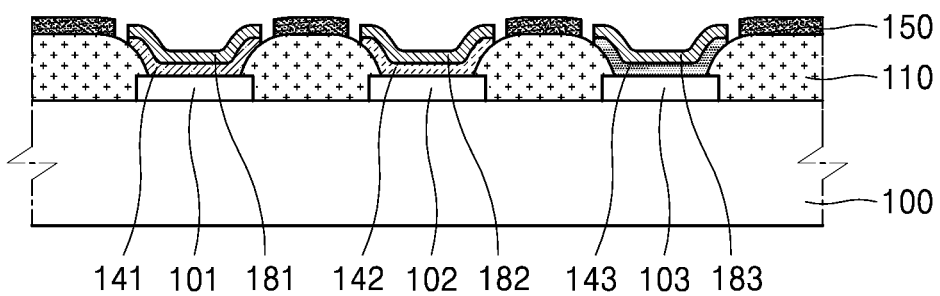

Referring to FIG. 7F, a lift-off process is performed on the structure illustrated in FIG. 7E.

The third lift-off layer 123 may include the fluoropolymer. Accordingly, a second solvent including fluorine may be used in the lift-off process. The third organic functional layer 143 may be formed and then the lift-off process is performed. Accordingly, the second solvent may include a material having a low reactivity with the third organic functional layer 143. Like the first solvent, the second solvent may include hydrofluoroether.

When the third lift-off layer 123 formed under the second portion 133-2 (see FIG. 7E) of the third photoresist 133 is lifted off, portions of the third organic functional layer 143 and the third auxiliary cathode 183 that were formed on the second portion 133-2 of the third photoresist 133 may be removed, and portions of the third organic functional layer 143 and the third auxiliary cathode 183 formed over the third anode 103 may remain as patterns.

As described above, an adhesive strength between the self-assembled monolayer 150 and the pixel-defining layer 110 may be sufficient such that the self-assembled monolayer 150 formed on the pixel-defining layer 110 is not removed when the third lift-off layer 123 is lifted off.

The first, second, and third organic functional layers 141, 142, and 143 may emit light of different colors. When the light of different colors emitted from the first to third organic functional layers 141, 142, and 143 is mixed, white light may be formed. For example, the first, second, and third organic functional layers 141, 142, and 143 may emit red light, green light, and blue light, respectively. For example, the first to third organic functional layers 141, 142, and 143 may be elements of sub-pixels constituting a unit pixel of the organic light-emitting display apparatus 1.

The organic light-emitting display apparatus 1 illustrated in FIG. 1 may represent one unit pixel. Embodiments may also be applied to an organic light-emitting display apparatus including a plurality of unit pixels that are the same as the unit pixel illustrated in FIG. 1. For example, a plurality of first organic functional layers 141, which emit a first color, may be simultaneously formed as first sub-pixels by using the first unit process. A plurality of second organic functional layers 142, which emit a second color, may be simultaneously formed as second sub-pixels by using the second unit process. A plurality of third organic functional layers 143, which emit a third color, may be simultaneously formed as third sub-pixels by using the third unit process. Through the first to third unit processes, full color may be realized.

In the present embodiment, when a self-assembled monolayer is formed between an anode and a lift-off layer without the formation of the lift-off layer directly on the anode, the self-assembled monolayer may prevent a residual film of the lift-off layer from being left on the anode, and thus deterioration of the organic light-emitting display apparatus 1 may be prevented.

Hereinafter, a method of manufacturing an organic light-emitting display apparatus 4 according to a comparative example is described with reference to FIGS. 18A to 20E.

FIGS. 18A to 18E illustrate cross-sectional views for explaining a first unit process of the organic light-emitting display apparatus 4 according to the comparative example. FIGS. 19A to 19E illustrate cross-sectional views for explaining a second unit process of the organic light-emitting display apparatus 4 according to the comparative example. FIGS. 20A to 20E illustrate cross-sectional views for explaining a third unit process of the organic light-emitting display apparatus 4 according to the comparative example.

Figure 18A:
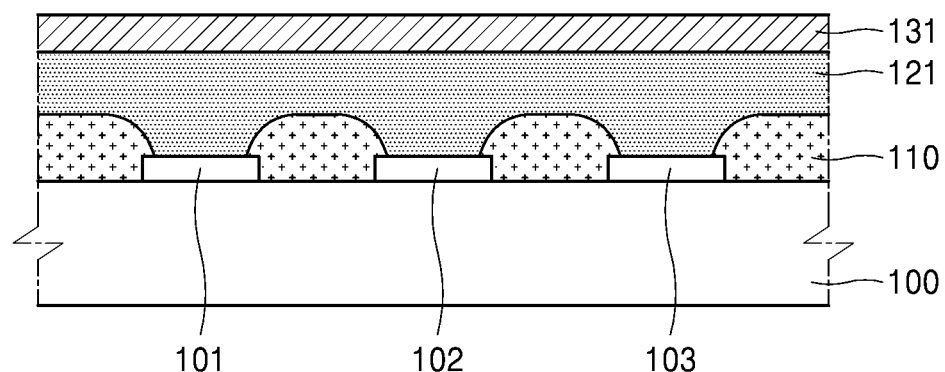
FIGS. 18A to 18E illustrate cross-sectional views for explaining a first unit process of forming an organic light-emitting display apparatus according to a comparative example.

Referring to FIG. 18A, a first lift-off layer 121 including a fluoropolymer is formed above a substrate 100 on which first to third anodes 101 to 103 and a pixel-defining layer 110 covering end portions of the first to third anodes 101 to 103 are formed, and a first photoresist 131 is formed on the first lift-off layer 121. The first photoresist 131 at a position corresponding to a first anode 101 is exposed through a first photomask M1 including an area M11 through which light L is transmitted.

Figure 18B:
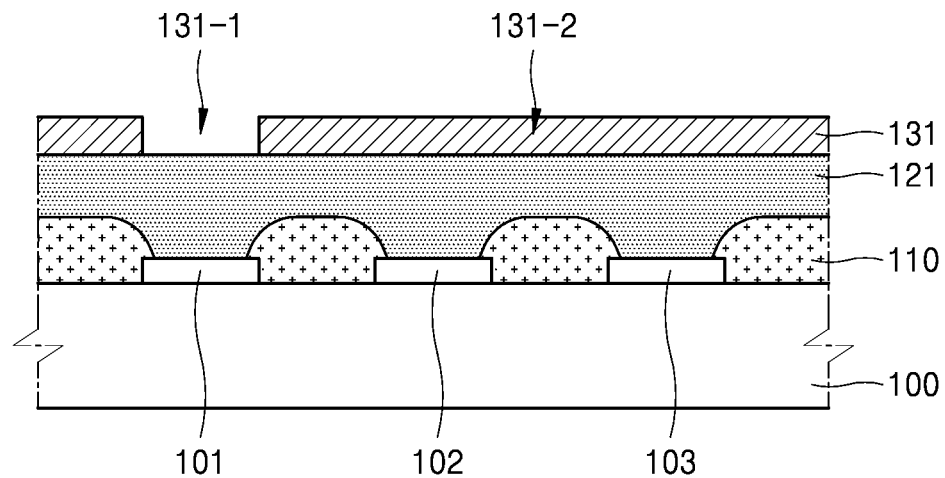

Referring to FIG. 18B, the first photoresist 131 is patterned. The first photoresist 131 that is exposed and developed is removed at the first portion 131-1 corresponding to the first anode 101 and remains at a second portion 131-2 other than the first portion 131-1.

Figure 18C:
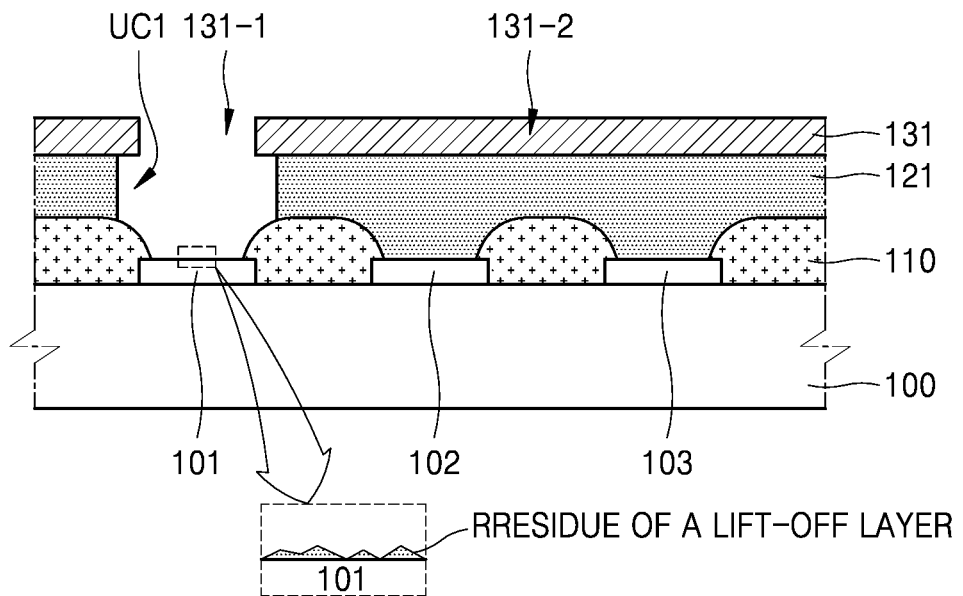

Referring to FIG. 18C, the first lift-off layer 121 is etched by using a pattern of the first photoresist 131 of FIG. 18B as an etch mask and using a first solvent (not shown) including fluorine. During an etching process, a portion of the first lift-off layer 121 formed at a position corresponding to the first portion 131-1, that is, on the first anode 101, is etched. The first lift-off layer 121 is etched to form a first undercut profile UC1 under a boundary surface of the first portion 131-1 of the first photoresist 131. When the first lift-off layer 121 is stripped after the etching process is performed, an undesirable residue of the first lift-off layer 121 may remain on the first anode 101.

Figure 18D:
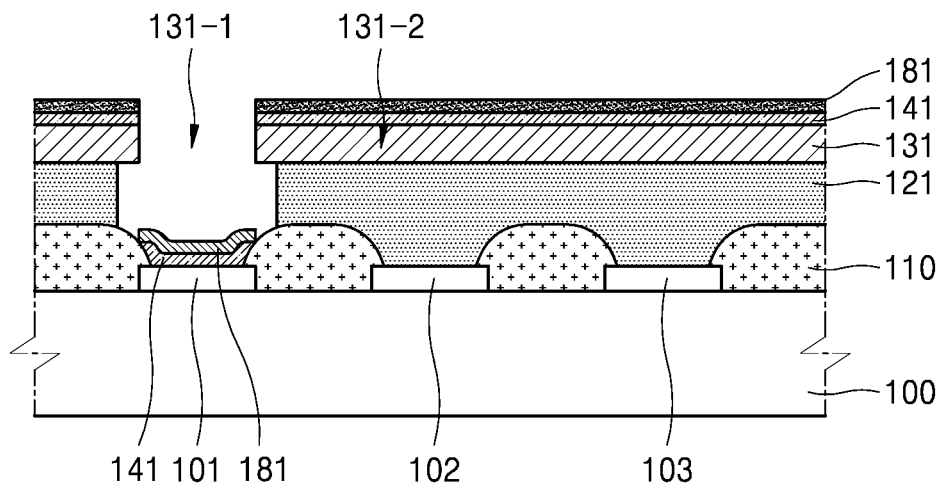

Referring to FIG. 18D, a first organic functional layer 141 and a first auxiliary cathode 181 are sequentially formed on a structure of FIG. 18C.

Figure 18E:
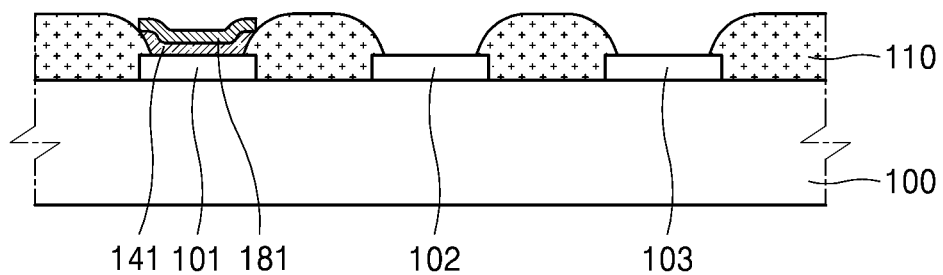

Referring to FIG. 18E, a first lift-off process is performed such that remaining portions of the first lift-off layer 121 are entirely removed, and as a result, the first organic functional layer 141 and the first auxiliary cathode 181 remain as patterns on the first anode 101.

After the first unit process is completed, the second unit process is performed on an area at which a second anode 102 is located.

Figure 19A:
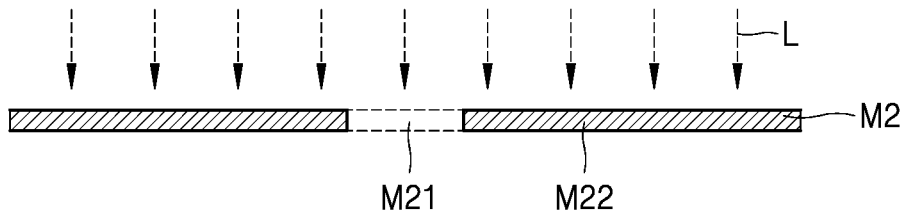
FIGS. 19A to 19E illustrate cross-sectional views for explaining a second unit process of the organic light-emitting display apparatus according to the comparative example.

Referring to FIG. 19A, a second lift-off layer 122 and a second photoresist 132 are sequentially formed on a structure of FIG. 18E.

Figure 19B:
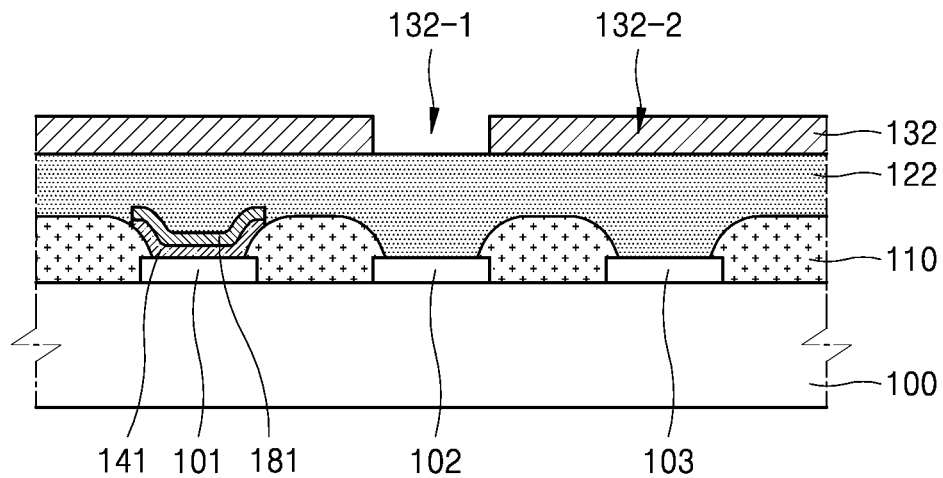

Referring to FIG. 19B, the second photoresist 132 is patterned. The second photoresist 132 that is exposed and developed is patterned to be removed at a first portion 132-1 corresponding to the second anode 102 and remain at a second portion 132-2 other than the first portion 132-1.

Figure 19C:
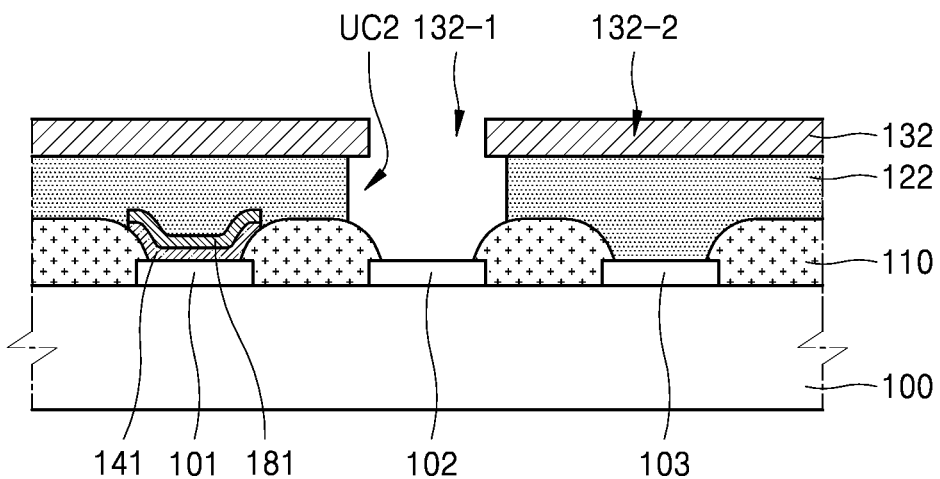

Referring to FIG. 19C, the second lift-off layer 122 is etched by using a pattern of the second photoresist 132 of FIG. 19B as an etch mask and using the first solvent (not shown) including fluorine. During an etching process, a portion of the second lift-off layer 122 formed at a position corresponding to the first portion 132-1, that is, on the second anode 102, is etched. The second lift-off layer 122 is etched to form a second undercut profile UC2 under a boundary surface of the first portion 132-1 of the second photoresist 132. When the second lift-off layer 122 is stripped after the etching process is performed, an undesirable residue of the second lift-off layer 122 may remain on the second anode 102.

Figure 19D:
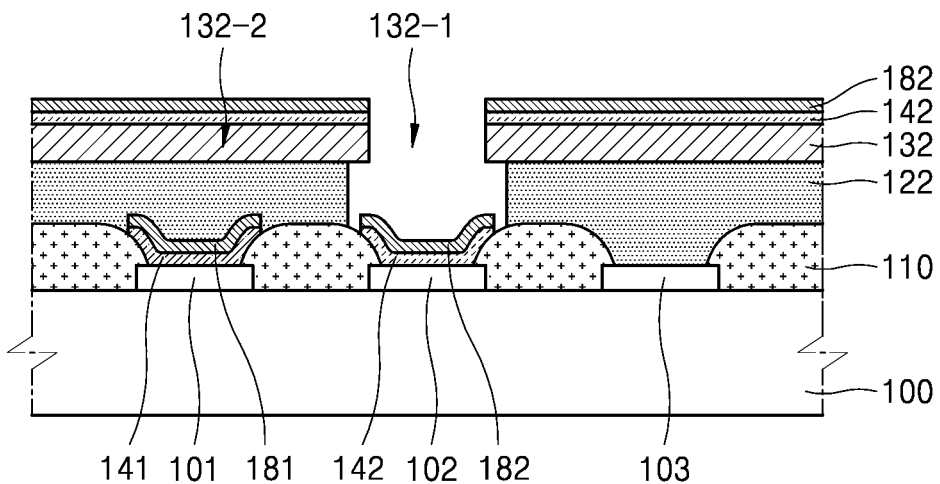

Referring to FIG. 19D, a second organic functional layer 142 and an auxiliary cathode 182 are sequentially formed on a structure of FIG. 19C.

Figure 19E:
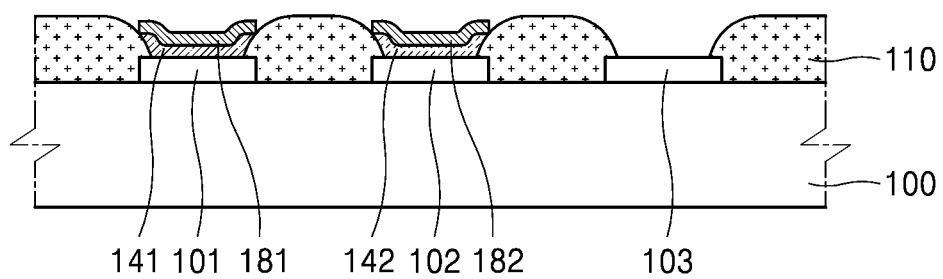

Referring to FIG. 19E, a second lift-off process is performed such that remaining portions of the second lift-off layer 122 are entirely removed, and as a result, the second organic functional layer 142 and the second auxiliary cathode 182 remain as patterns on the second anode 102.

After the second unit process is completed, the third unit process is performed on an area at which a third anode 103 is located.

Figure 20A:
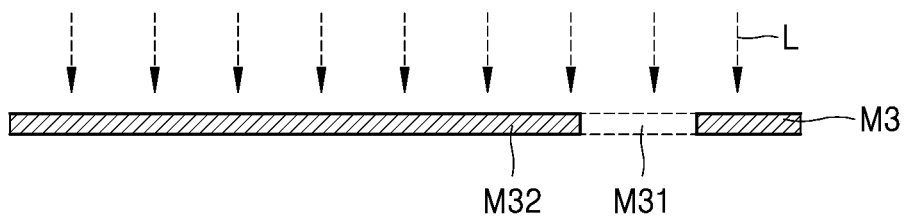
FIGS. 20A to 20E illustrate cross-sectional views for explaining a third unit process of the organic light-emitting display apparatus according to the comparative example.
Figure 20A:
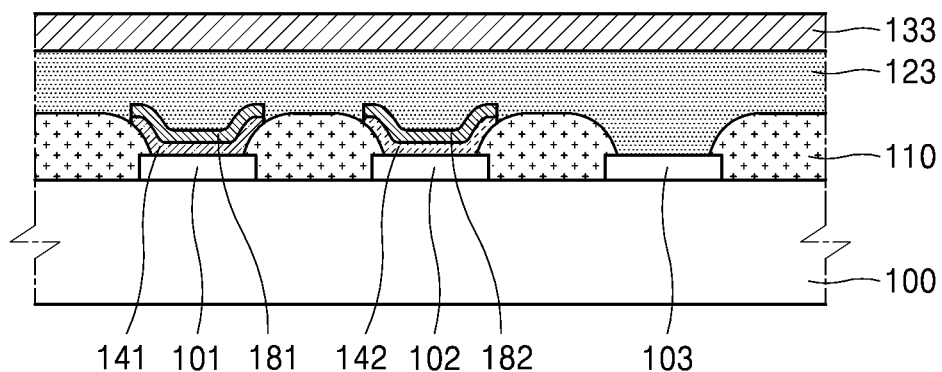

Referring to FIG. 20A, a third lift-off layer 123 and a third photoresist 133 are sequentially formed on a structure of FIG. 19E.

Figure 20B:
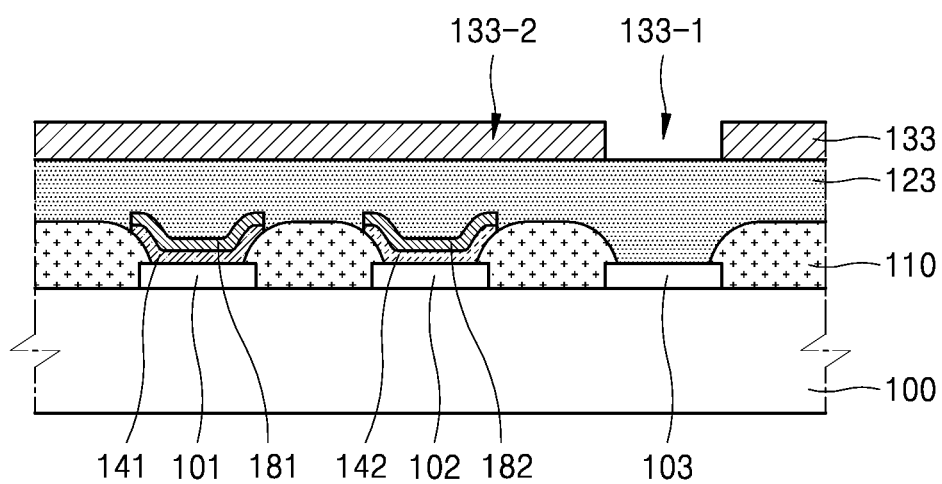

Referring to FIG. 20B, the third photoresist 132 is patterned. The third photoresist 133 that is exposed and developed is patterned to be removed at a first portion 133-1 corresponding to the third anode 103 and remain at a second portion 133-2 other than the first portion 133-1.

Figure 20C:
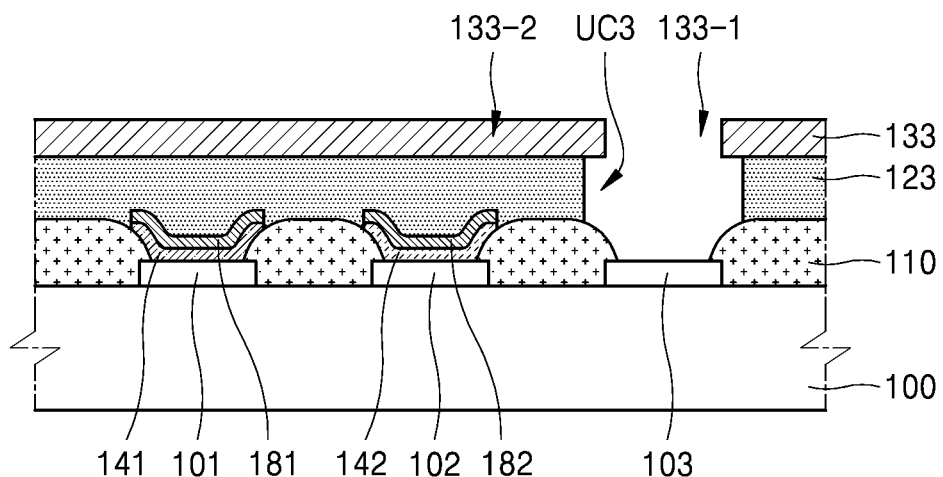

Referring to FIG. 20C, the third lift-off layer 123 is etched by using a pattern of the third photoresist 133 of FIG. 20B as an etch mask and using the first solvent (not shown) including fluorine. During an etching process, a portion of the third lift-off layer 123 formed at a position corresponding to the first portion 133-1, that is, on the third anode 103, is etched. The third lift-off layer 123 is etched to form a third undercut profile UC3 under a boundary surface of the first portion 133-1 of the third photoresist 133. When the third lift-off layer 123 is stripped after the etching process is performed, an undesirable residue of the third lift-off layer 123 may remain on the third anode 102.

Figure 20D:
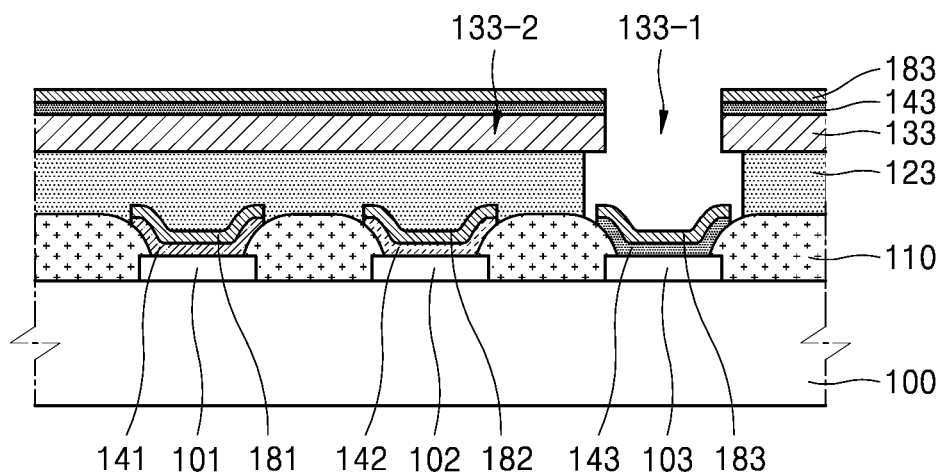

Referring to FIG. 20D, a third organic functional layer 143 and a third auxiliary cathode 183 are sequentially formed on a structure of FIG. 20C.

Figure 20E:
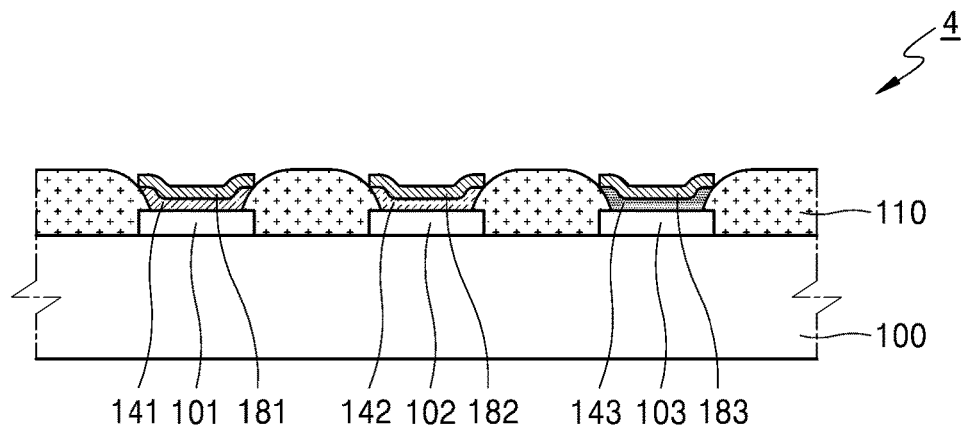

Referring to FIG. 20E, a third lift-off process is performed such that remaining portions of the third lift-off layer 123 are entirely removed, and as a result, the third organic functional layer 143 and the third auxiliary cathode 183 remain as patterns on the third anode 103.

That is, according to the comparative example, when a lift-off layer is formed directly on an anode and then is patterned, it may not be possible to prevent a residual film of the lift-off layer from remaining on the anode.

Hereinafter, with reference to FIGS. 8 to 14F, an organic light-emitting display apparatus 2 according to an embodiment and a method of manufacturing the organic light-emitting display apparatus 2 are disclosed.

Figure 8:
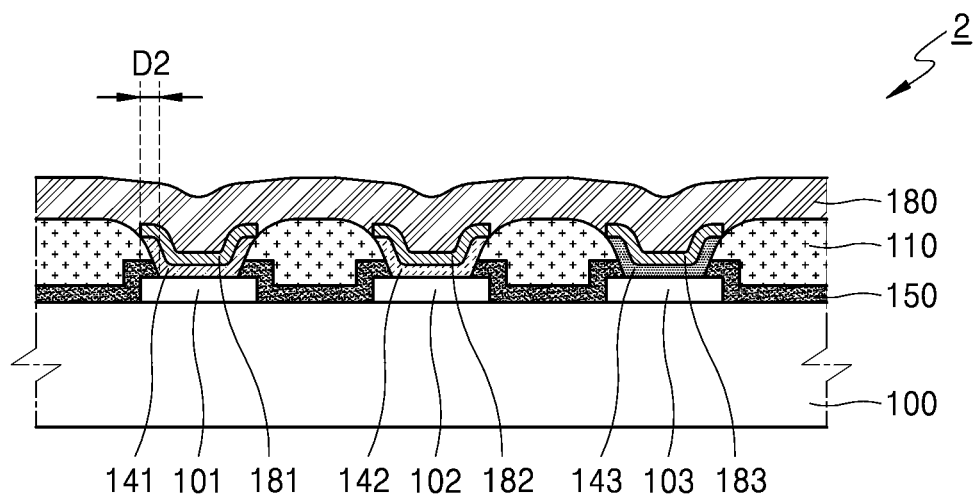
FIG. 8 illustrates a cross-sectional view of an organic light-emitting display apparatus according to an embodiment.
Figure 9:
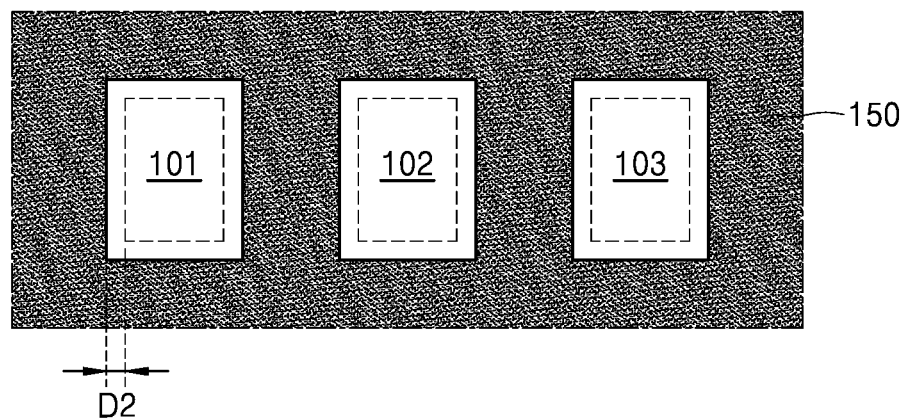
FIG. 9 illustrates a plan view of a portion of the organic light-emitting display apparatus according to the embodiment illustrated in FIG. 8.

FIG. 8 illustrates a cross-sectional view of an organic light-emitting display apparatus 2 according to an embodiment, and FIG. 9 illustrates a plan view of a portion of the organic light-emitting display apparatus 2 according to the embodiment.

Referring to FIGS. 8 and 9, a plurality of anodes including a first anode 101, a second anode 102, and a third anode 103 that are spaced apart from each other on a substrate 100 may be provided. First to third organic functional layers 141, 142, and 143 including first to third emission layers may be respectively located on the first to third anodes 101, 102, and 103. First to third auxiliary cathodes 181, 182, and 183 including a conductive material may be respectively located on the first to third organic functional layers 141, 142, and 143. An integrally formed common electrode 180 may be located on the first to third auxiliary cathodes 181, 182, and 183.

In the organic light-emitting display apparatus 2 according to the embodiment, a self-assembled monolayer 150 may surround the first to third anodes 101, 102 and 103, and a pixel-defining layer 110 may be formed on the self-assembled monolayer 150. For example, portions of the self-assembled monolayer 150 may be under the pixel defining layer. In this embodiment, the self-assembled monolayer 150 may overlap end portions of the first to third anodes 101, 102, and 103 by a predetermined thickness D2. Hereinafter, descriptions of this embodiment that are the same as those of the above-described embodiment illustrated in FIG. 1 may be omitted.

Figure 10:
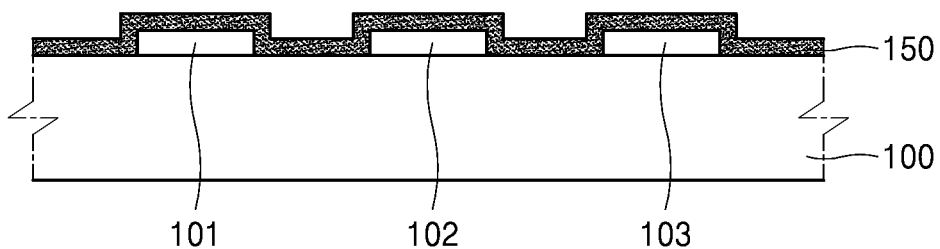
FIG. 10 illustrates a cross-sectional view for explaining an operation of forming a plurality of anodes and a self-assembled monolayer on a substrate of the organic light-emitting display apparatus according to the embodiment illustrated in FIG. 8.

Referring to FIG. 10, a plurality of anodes including the first anode 101, the second anode 102, and the third anode 103 may be formed on the substrate 100, and the self-assembled monolayer 150 may be formed over the plurality of anodes.

Figure 11:
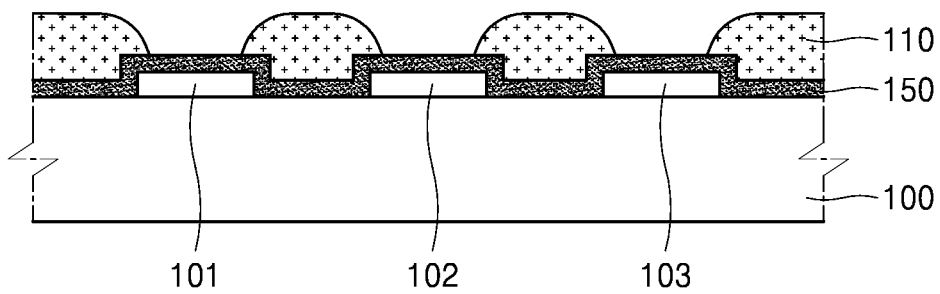
FIG. 11 illustrates a cross-sectional view for explaining forming a pixel-defining layer in the organic light-emitting display apparatus according to the embodiment illustrated in FIG. 8.

Referring to FIG. 11, the pixel-defining layer 110 may be formed to surround edges of the first anode 101, the second anode 102, and the third anode 103. In this case, an end portion of the pixel-defining layer 110 may overlap an end portion of the self-assembled monolayer 150. The self-assembled monolayer 150 may include a fluorine-containing functional group and a hydrolyzable reactive group.

Figure 12A:
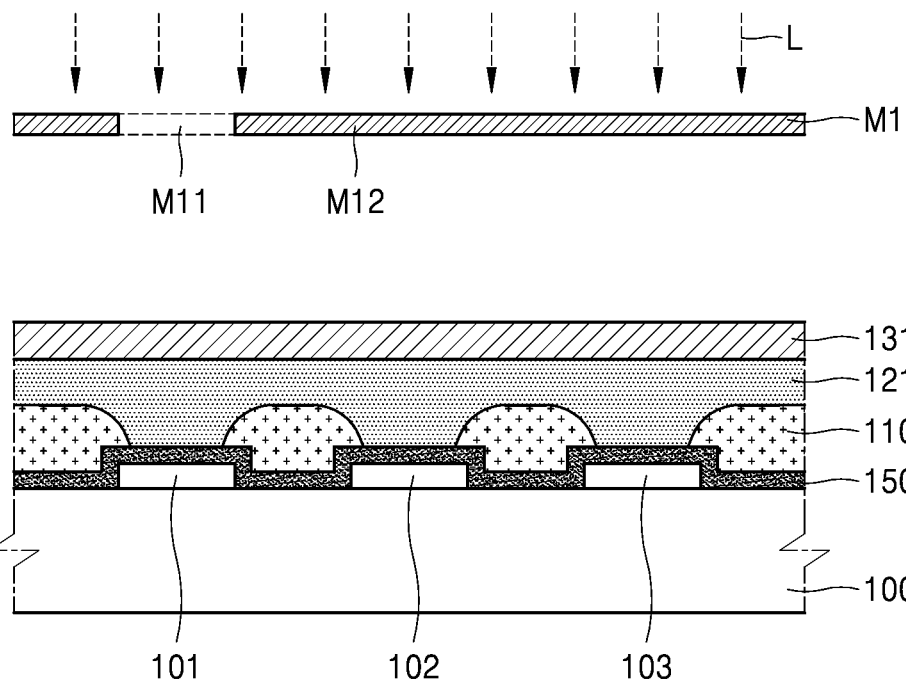
FIGS. 12A to 12F illustrate cross-sectional views for explaining stages of a first unit process of forming the organic light-emitting display apparatus according to the embodiment illustrated in FIG. 8.

Referring to FIG. 12A, a first lift-off layer 121 and a first photoresist 131 may be sequentially formed on the structure illustrated in FIG. 11.

The first lift-off layer 121 may include a fluoropolymer and may be formed by using a coating method, a printing method, or a deposition method. The first photoresist 131 may be formed on the first lift-off layer 121. The first photoresist 131 at a position corresponding to the first anode 101 may be exposed through a first photomask M1 including an area M11 through which light L is transmitted.

The fluorine-containing functional group of the self-assembled monolayer 150 that closely contacts the first lift-off layer 121 may have a small difference in surface energy with respect to the first lift-off layer 121, and thus the first lift-off layer 121 may be uniformly formed on the self-assembled monolayer 150.

Figure 12B:
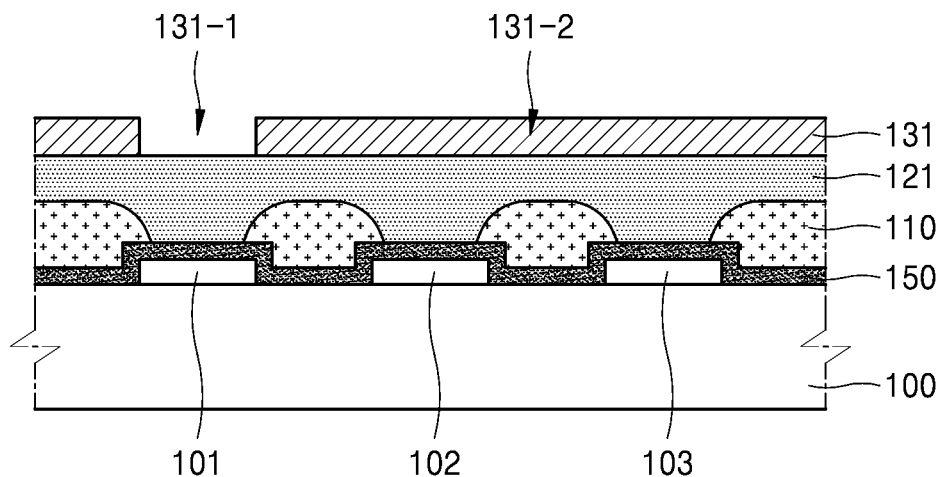

Referring to FIG. 12B, the first photoresist 131 may be developed. In the first photoresist 131 that is developed, a first portion 131-1 corresponding to the first anode 101 may be removed and a second portion 131-2 other than the first portion 131-1 may remain.

Figure 12C:
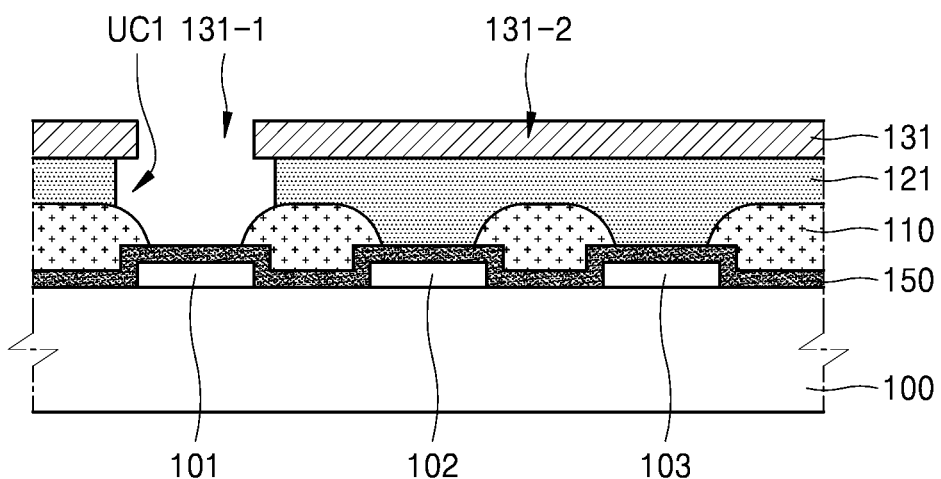

Referring to FIG. 12C, the first lift-off layer 121 may be etched by using a pattern of the first portion 131-1 of the first photoresist 131 as an etch mask. During an etching process, a portion of the first lift-off layer 121 formed at a position corresponding to the first portion 131-1, that is, above the first anode 101, may be etched. The first lift-off layer 121 may be etched by a first solvent including fluorine to form a first undercut profile UC1-1 under a boundary surface of the first portion 131-1 of the first photoresist 131.

The self-assembled monolayer 150 may be well bonded to the top surface of the first anode 101 while the first lift-off layer 121 is etched.

Figure 12D:
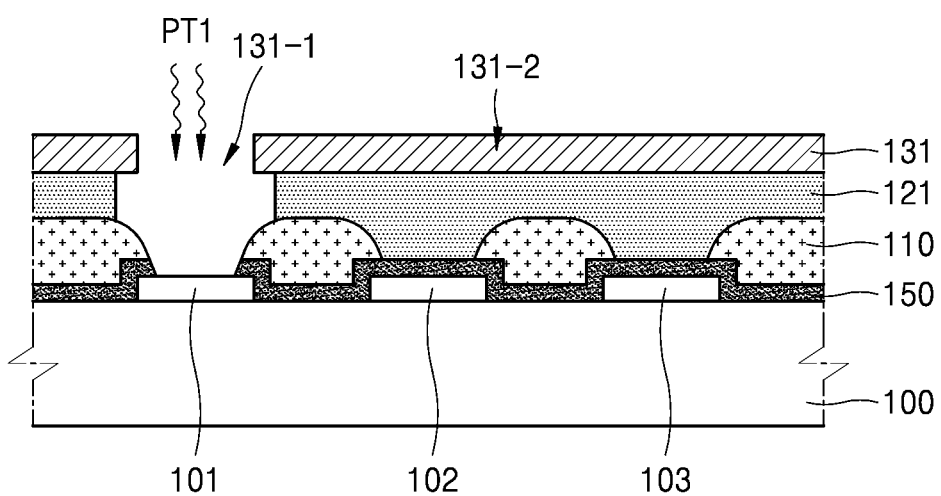

Referring to FIG. 12D, a portion of the self-assembled monolayer 150 on the first anode 101 may be removed by performing first plasma heat treatment on the structure illustrated in FIG. 12C.

The Si—O bond between the first anode 101 and the self-assembled monolayer 150 shown in FIG. 21 may be cleanly broken by the first plasma heat treatment.

Figure 12E:
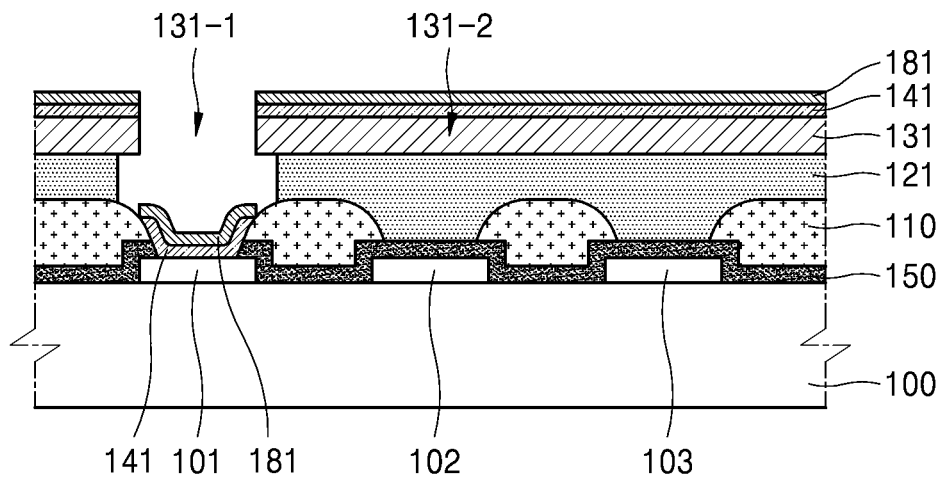

Referring to FIG. 12E, a first organic functional layer 141 including a first emission layer and a first auxiliary cathode 181 are sequentially formed on the structure illustrated in FIG. 12D. A portion of the first organic functional layer 141 may be formed at a position corresponding to the first portion 131-1, that is, above the first anode 101, and another portion of the first organic functional layer 141 may be formed on the second portion 131-2 of the first photoresist 131. A portion of the first auxiliary cathode 181 may be formed to cover a top surface of the first organic functional layer 141, and another portion of the first auxiliary cathode 181 may be formed on the first organic functional layer 141 on the second portion 131-2 of the first photoresist 131 other than the first portion 131-1.

Figure 12F:
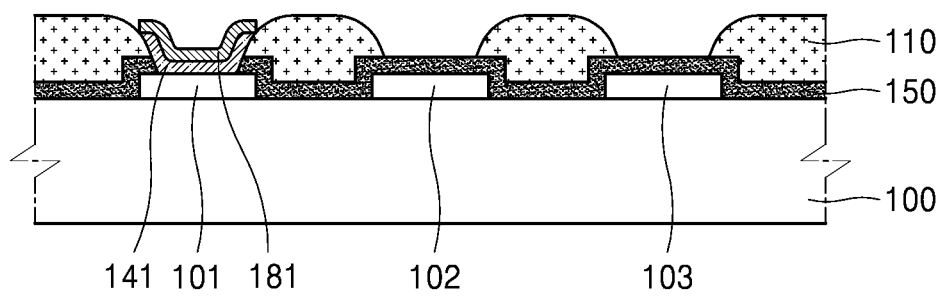

Referring to FIG. 12F, a lift-off process may be performed on the structure illustrated in FIG. 12E. When the first lift-off layer 121 formed under the second portion 131-2 (see FIG. 12E) of the first photoresist 131 is lifted off, portions of the first organic functional layer 141 and the first auxiliary cathode 181 formed over the second portion 131-2 of the first photoresist 131 may be removed, and portions of the first organic functional layer 141 and the first auxiliary cathode 181 formed over the first anode 101 may remain as patterns.

After the first unit process is performed, a second unit process of forming the second organic functional layer 142 that emits light of a different color from a color of light emitted by the first organic functional layer 141 may be performed on an area where the second anode 102 is located. The second unit process will now be described with reference to FIGS. 13A to 13F.

Figure 13A:
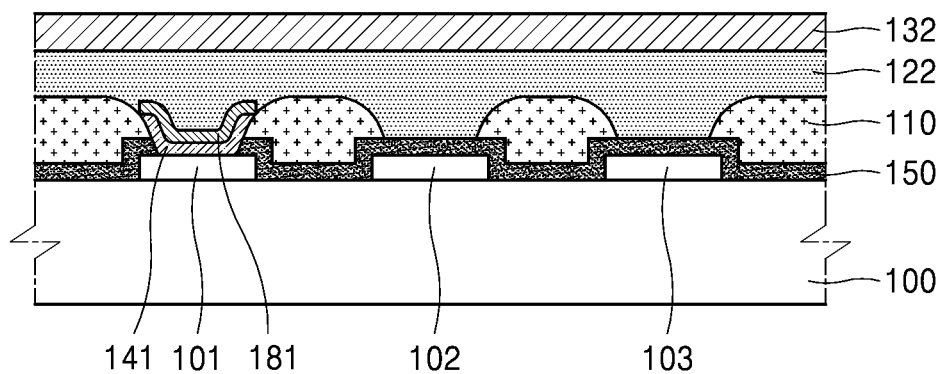
FIGS. 13A to 13F illustrate cross-sectional views for explaining stages of a second unit process of forming the organic light-emitting display apparatus according to the embodiment illustrated in FIG. 8.

Referring to FIG. 13A, a second lift-off layer 122 and a second photoresist 132 may be sequentially formed on the structure illustrated in FIG. 12F. The second photoresist 132 at a position corresponding to the second anode 102 may be exposed through a second photomask M2 including an area M21 through which light L is transmitted.

The fluorine-containing functional group of the self-assembled monolayer 150 that closely contacts the second lift-off layer 122 may have a small difference in surface energy with respect to the second lift-off layer 122, and thus the second lift-off layer 122 may be uniformly formed on the self-assembled monolayer 150.

Figure 13B:
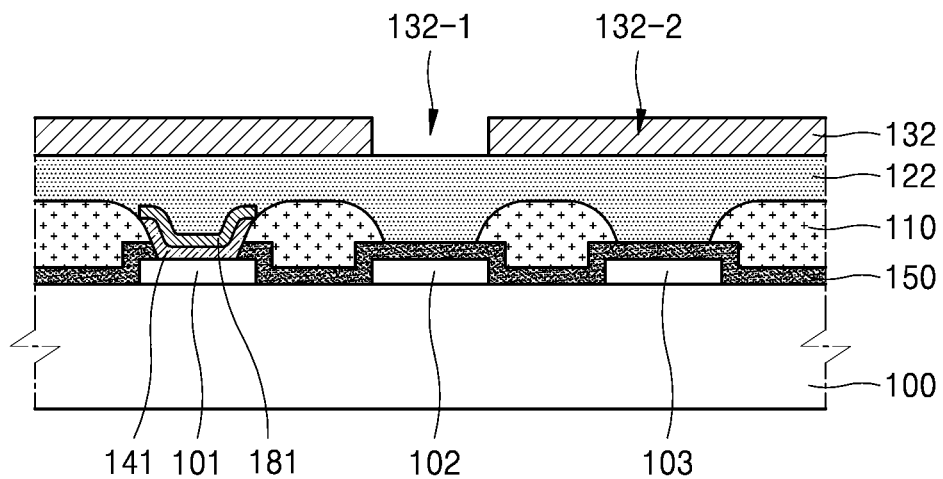

Referring to FIG. 13B, the second photoresist 132 may be developed. In the second photoresist 132, a first portion 132-1 corresponding to the second anode 102 is removed and a second portion 132-2 other than the first portion 132-1 may remain.

Figure 13C:
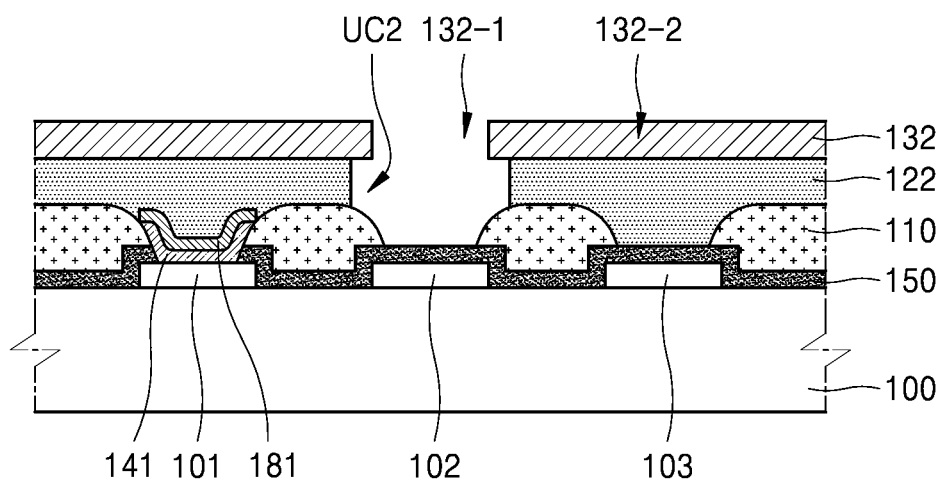

Referring to FIG. 13C, the second lift-off layer 122 may be etched by using a pattern of the first portion 132-1 of the second photoresist 132 as an etch mask. A portion of the second lift-off layer 122 formed at a position corresponding to the first portion 132-1, that is, above the second anode 102, may be etched during an etching process. The second lift-off layer 122 may be etched by the first solvent including fluorine to form a second undercut profile UC2-1 under a boundary surface of the first portion 132-1 of the second photoresist 132. The self-assembled monolayer 150 may be well bonded to the top surface of the second anode 102 while the second lift-off layer 122 is etched.

Figure 13D:
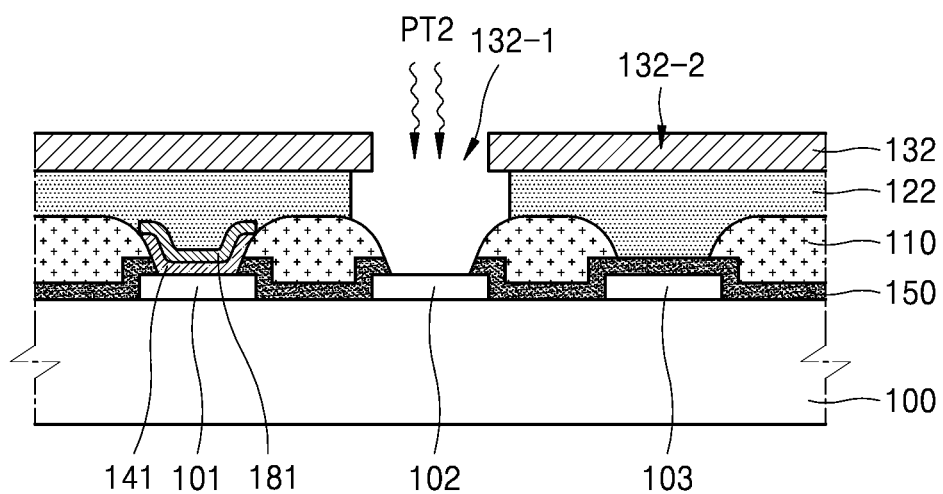

Referring to FIG. 13D, a portion of the self-assembled monolayer 150 on the second anode 102 may be removed by performing a second plasma heat treatment PT2 on the structure illustrated in FIG. 13C. An Si—O bond between the second anode 102 and the self-assembled monolayer 150 may be cleanly broken by the second plasma heat treatment.

Figure 13E:
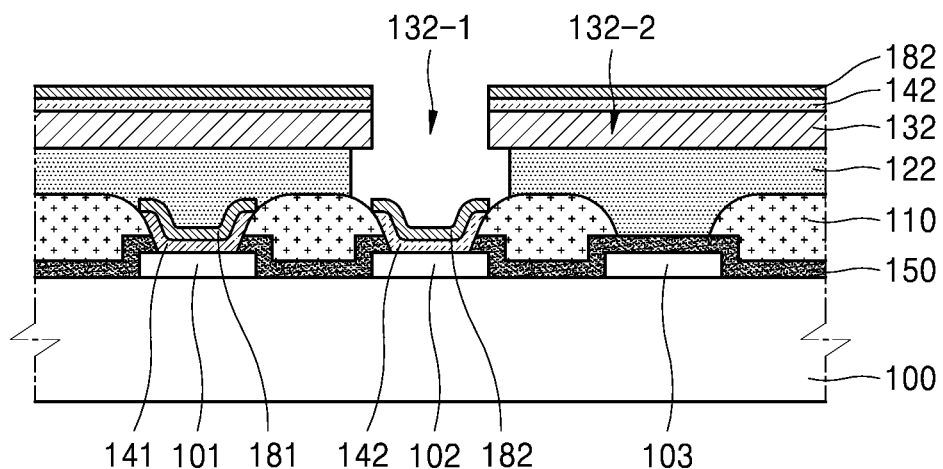

Referring to FIG. 13E, a second organic functional layer 142 including a second emission layer and a second auxiliary cathode 182 may be sequentially formed on the structure illustrated in FIG. 13D. A portion of the second organic functional layer 142 may be formed at a position corresponding to the first portion 132-1, that is, above the second anode 102, and the other portion of the second organic functional layer 142 may be formed on the second portion 132-2 of the second photoresist 132. A portion of the second auxiliary cathode 182 may be formed to cover a top surface of the second organic functional layer 142, and the other portion of the second auxiliary cathode 182 may be formed on the second organic functional layer 142 on the second portion 132-2 of the second photoresist 132 other than the first portion 132-1.

Figure 13F:
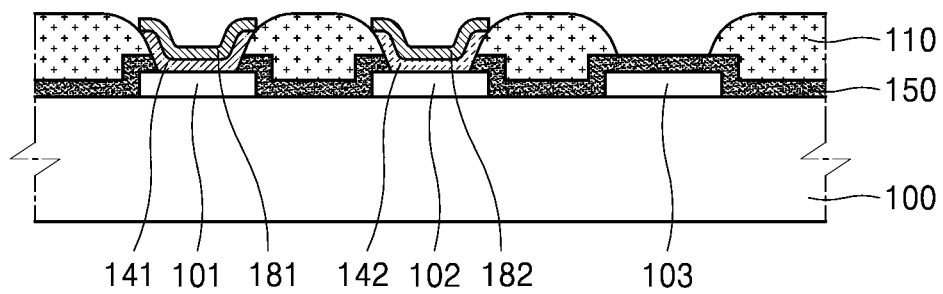

Referring to FIG. 13F, a lift-off process may be performed on a structure illustrated in FIG. 13E. When the second lift-off layer 122 formed under the second portion 132-2 of the second photoresist 132 is lifted off, portions of the second organic functional layer 142 and the second auxiliary cathode 182 formed over the second portion 132-2 of the second photoresist 132 may be removed, and portions of the second organic functional layer 142 and the second auxiliary cathode 182 formed over the second anode 102 may remain as patterns.

After the second unit process is performed, a third unit process of forming the third organic functional layer 143 that emits light of a different color from a color of light emitted by the first and second organic functional layers 141 and 142 may be performed on an area where the third anode 103 is located. The third unit process will now be described with reference to FIGS. 14A to 14F.

Figure 14A:
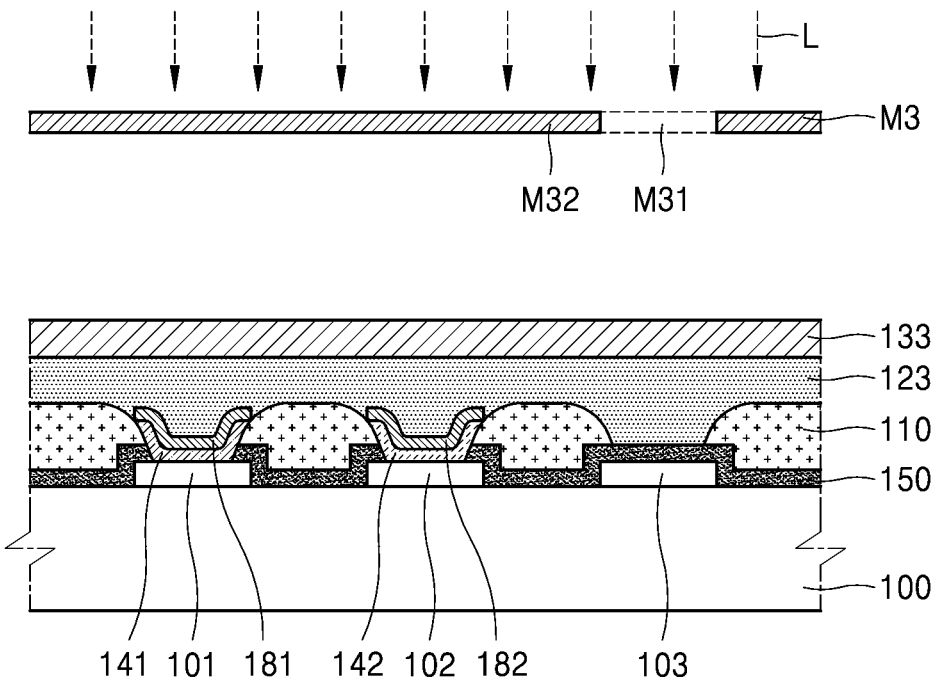
FIGS. 14A to 14F illustrate cross-sectional views for explaining a third unit process of forming the organic light-emitting display apparatus according to the embodiment illustrated in FIG. 8.

Referring to FIG. 14A, a third lift-off layer 123 and a third photoresist 133 may be sequentially formed on the structure illustrated in FIG. 13F. The third photoresist 133 at a position corresponding to the third anode 103 may be exposed through a third photomask M3 including an area M31 through which light L is transmitted.

The fluorine-containing functional group of the self-assembled monolayer 150 that closely contacts the third lift-off layer 123 may have a small difference in surface energy with respect to the third lift-off layer 123, and thus the third lift-off layer 123 may be uniformly formed on the self-assembled monolayer 150.

Figure 14B:
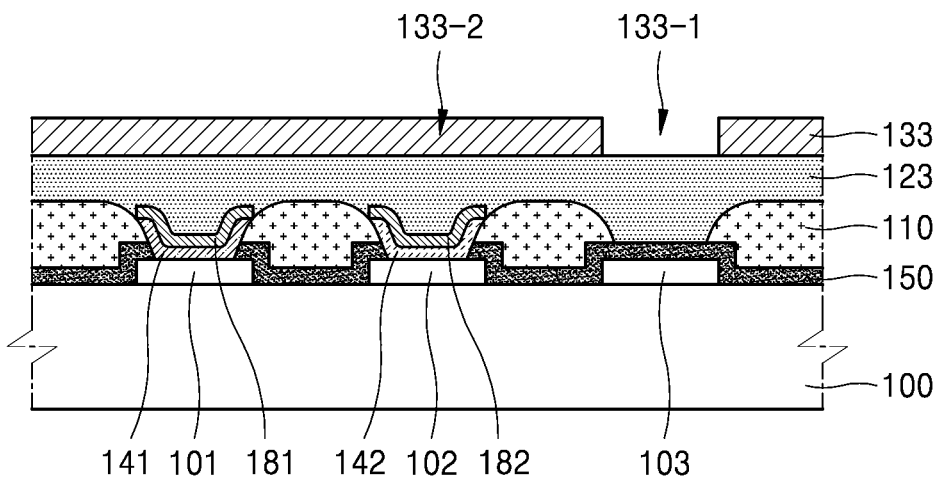

Referring to FIG. 14B, the third photoresist 133 may be developed. In the third photoresist 133, a first portion 133-1 corresponding to the third anode 103 may be removed and a second portion 133-2 other than the first portion 133-1 may remain.

Figure 14C:
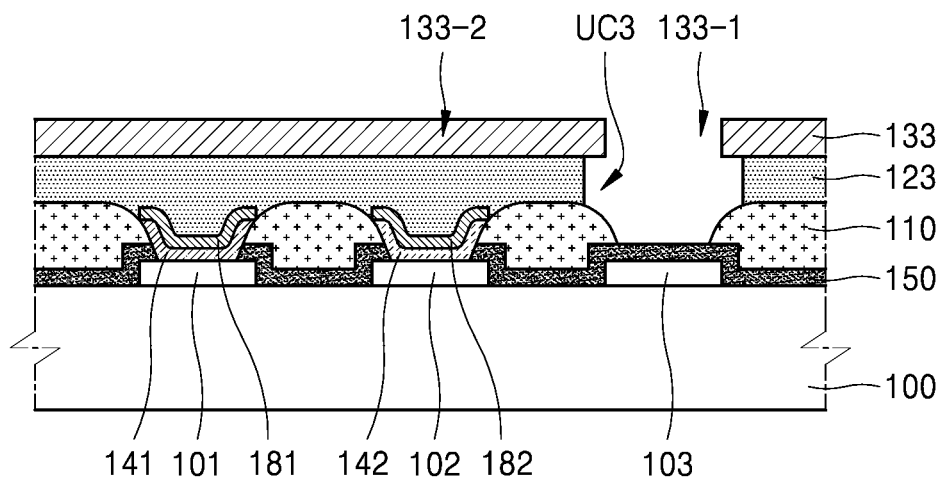

Referring to FIG. 14C, the third lift-off layer 123 may be etched by using a pattern of the first portion 133-1 of the third photoresist 133 as an etch mask. A portion of the third lift-off layer 123 formed at a position corresponding to the first portion 133-1, that is, above the third anode 103, may be etched during an etching process. The third lift-off layer 123 may be etched by the first solvent including fluorine to form a third undercut profile UC3-1 under a boundary surface of the first portion 133-1 of the third photoresist 133. The self-assembled monolayer 150 may be well bonded to the top surface of the third anode 103 while the third lift-off layer 123 is etched.

Figure 14D:
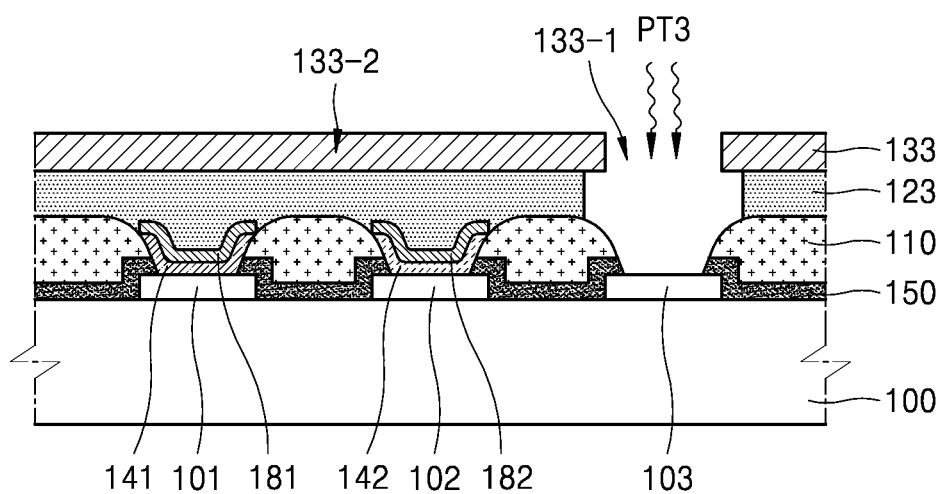

Referring to FIG. 14D, a portion of the self-assembled monolayer 150 on the emission layer and a third auxiliary cathode 183 may be sequentially formed the a third anode 103 may be removed by performing a third plasma heat treatment on a structure illustrated in FIG. 14C. An Si—O bond between the third anode 103 and the self-assembled monolayer 150 may be cleanly broken by the third plasma heat treatment.

Figure 14E:
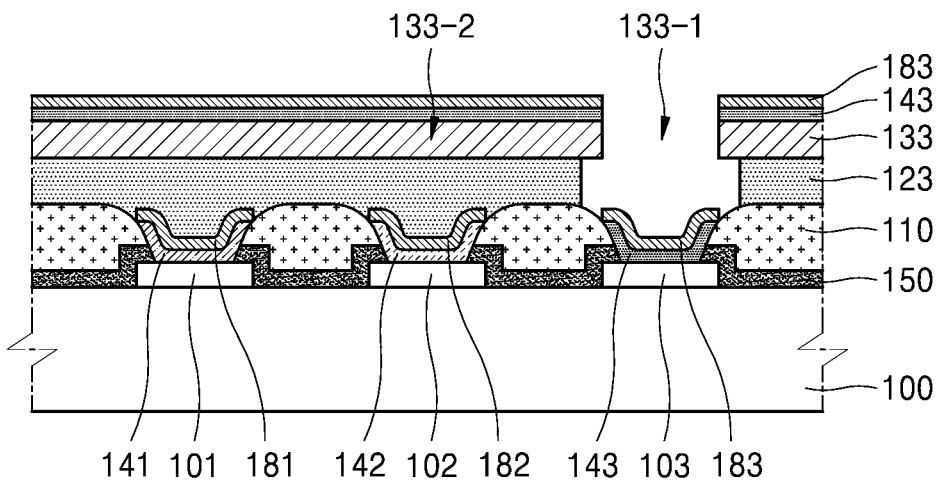

Referring to FIG. 14E, a third organic functional layer 143 including a third structure illustrated in FIG. 14D. A portion of the third organic functional layer 143 may be formed at a position corresponding to the first portion 133-1, that is, above the third anode 103, and another portion of the third organic functional layer 143 may be formed on the second portion 133-2 of the third photoresist 133. A portion of the third auxiliary cathode 183 may be formed to cover a top surface of the third organic functional layer 143, and another portion of the third auxiliary cathode 183 may be formed on the third organic functional layer 143 on the second portion 133-2 of the third photoresist 133 other than the first portion 133-1.

Figure 14F:
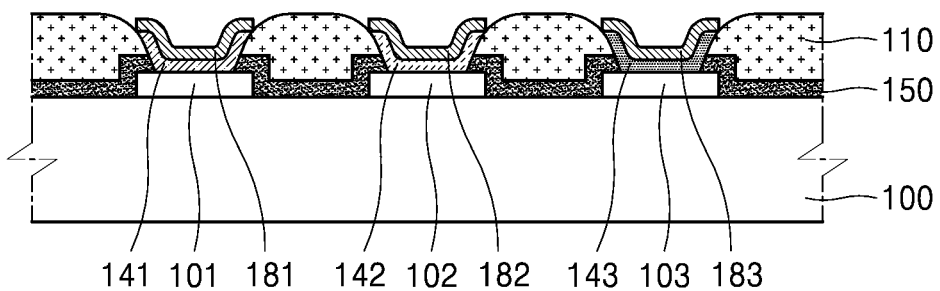

Referring to FIG. 14F, a lift-off process may be performed on the structure illustrated in FIG. 14E. When the third lift-off layer 123 formed under the second portion 133-2 of the third photoresist 133 is lifted off, portions of the third organic functional layer 143 and the third auxiliary cathode 183 formed over the second portion 133-2 of the third photoresist 133 may be removed, and portions of the third organic functional layer 143 and the third auxiliary cathode 183 formed over the third anode 103 may remain as patterns.

Hereinafter, a method for manufacturing an organic light-emitting display apparatus 3 according to an embodiment will be briefly described with reference to FIGS. 15A to 17E.

The present embodiment differs from the previous embodiments in that a self-assembled monolayer is used as a lift-off layer without independently using the lift-off layer and the self-assembled monolayer.

FIGS. 15A to 15E illustrate cross-sectional views for explaining a first unit process of an organic light-emitting display apparatus 3 according to the embodiment.

Figure 15A:
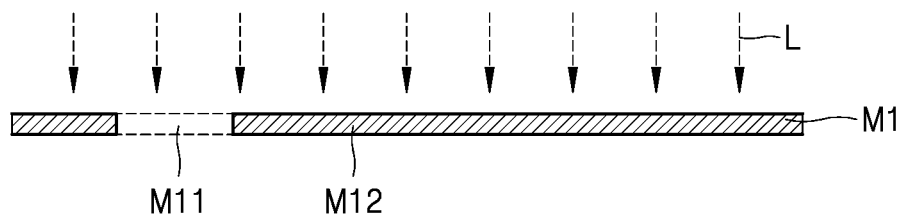
FIGS. 15A to 15E illustrate cross-sectional views for explaining a first unit process of forming an organic light-emitting display apparatus according to an embodiment.

Referring to FIG. 15A, first to third anodes 101, 102, and 103 may be formed on a substrate 101, and a pixel defining layer 110 defining a plurality of pixels may be formed to cover end portions of the first to third anodes 101, 102, and 103. After the pixel-defining layer 110 is formed, a first self-assembled monolayer 151 may be formed. A first photoresist 131 may be formed on the first self-assembled monolayer 151.

The first self-assembled monolayer 151 may include a hydrolyzable reactive group and a fluorine-containing functional group. In the present embodiment, as described above, the first photoresist 131 may be formed on the first self-assembled monolayer 151. The first photoresist 131 may, but need not, include a fluoropolymer. Accordingly, the first self-assembled monolayer 151 of the present embodiment need not include a fluorine-containing functional group as in the above-described embodiment. For example, the first self-assembled monolayer 151 may further include octadecyltrichlorosilane (OTS), dichlorodimethylsilane (DDMS), tetraethoxysilane (TEOS), or the like.

The first photoresist 131 at a position corresponding to the first anode 101 may be exposed through a first photomask M1 including an area M11 through which light L is transmitted. The fluorine-containing functional group of the first self-assembled monolayer 151 that closely contacts the first photoresist 131 may use a material having a small difference in surface energy with respect to a photosensitive material contained in the first photoresist 131.

Figure 15B:
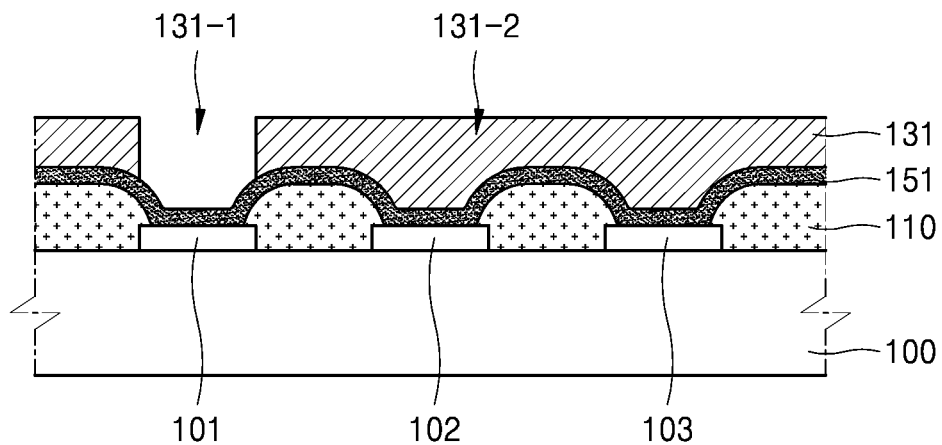

Referring to FIG. 15B, the first photoresist 131 may be developed. In the first photoresist 131 that is developed, a first portion 131-1 corresponding to the first anode 101 may removed and a second portion 131-2 other than the first portion 131-1 may remain.

Figure 15C:
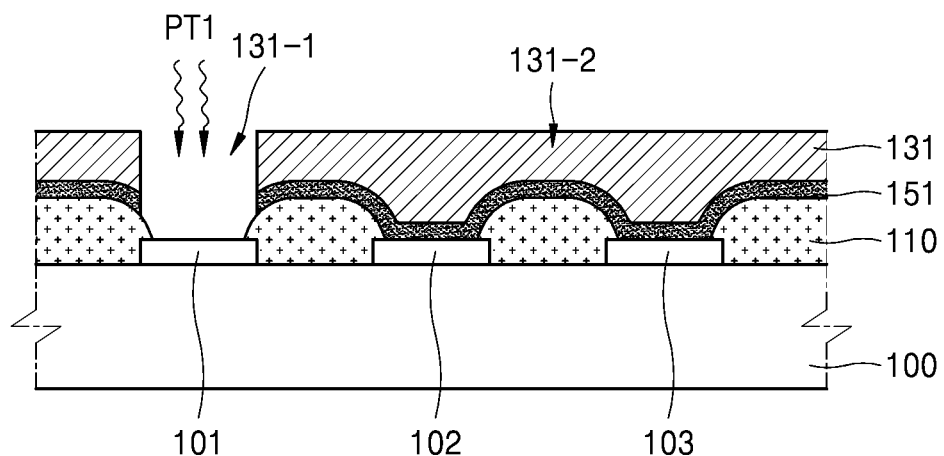

Referring to FIG. 15C, a portion of the first self-assembled monolayer 151 on the first anode 101 may be removed by performing a first plasma heat treatment PT1 on the structure illustrated in FIG. 15B. An Si—O bond between the first anode 101 and the first self-assembled monolayer 151 may be cleanly broken by the first plasma heat treatment PT1.

Figure 15D:
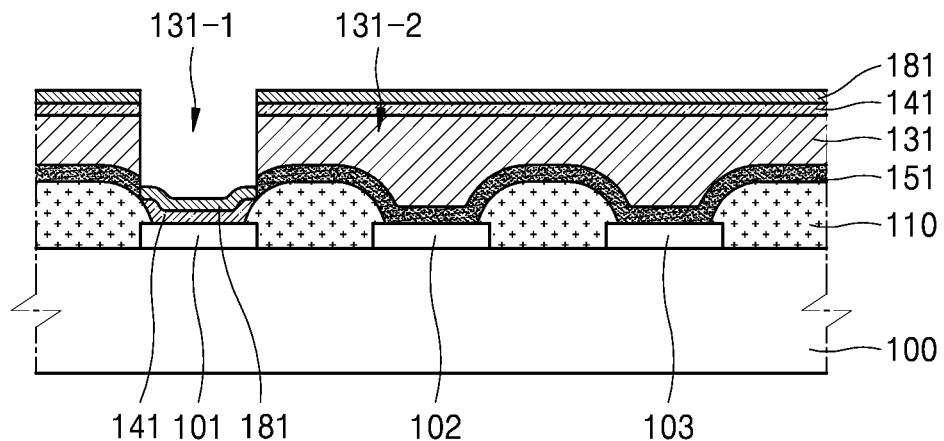

Referring to FIG. 15D, a first organic functional layer 141 including a first emission layer and a first auxiliary cathode 181 may be sequentially formed on the structure illustrated in FIG. 15C. A portion of the first organic functional layer 141 may be formed at a position corresponding to the first portion 131-1, that is, above the first anode 101, and another portion of the first organic functional layer 141 may be formed on the second portion 131-2 of the first photoresist 131. A portion of the first auxiliary cathode 181 may be formed to cover a top surface of the first organic functional layer 141, and another portion of the first auxiliary cathode 181 may be formed on the first organic functional layer 141 on the second portion 131-2 of the first photoresist 131 other than the first portion 131-1.

Figure 15E:
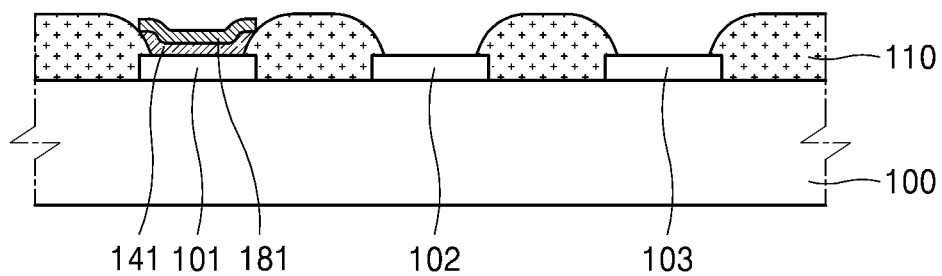

Referring to FIG. 15E, a lift-off process may be performed on the structure illustrated in FIG. 15D. When the first photoresist 131 is lifted off, portions of the first organic functional layer 141 and the first auxiliary cathode 181 formed over the second portion 131-2 of the first photoresist 131 may be removed, and portions of the first organic functional layer 141 and the first auxiliary cathode 181 formed over the first anode 101 may remain as patterns. The first self-assembled monolayer 151 located between the pixel-defining layer 110 and the first photoresist 131 may also be removed.

FIGS. 16A to 16E illustrate cross-sectional views for explaining a second unit process of the organic light-emitting display apparatus 3 according to this embodiment.

Figure 16A:
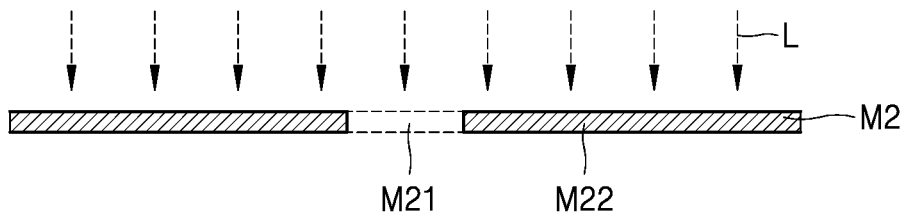
FIGS. 16A to 16E illustrate cross-sectional views for explaining a second unit process of forming the organic light-emitting display apparatus following the first unit process illustrated in FIGS. 15A to 15E according to an embodiment.
Figure 16A:
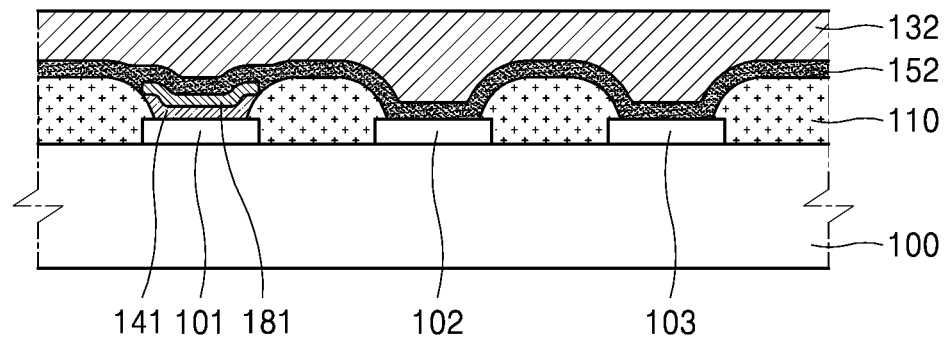

Referring to FIG. 16A, a second self-assembled monolayer 152 and a second photoresist 132 may be sequentially formed on the structure illustrated in FIG. 15E. The second photoresist 132 at a position corresponding to the second anode 102 may be exposed through a second photomask M2 including an area M21 through which light L is transmitted. A functional group of the second self-assembled monolayer 152 that closely contacts the second photoresist 132 may use a material having a small difference in surface energy with respect to a photosensitive material contained in the second photoresist 132.

Figure 16B:
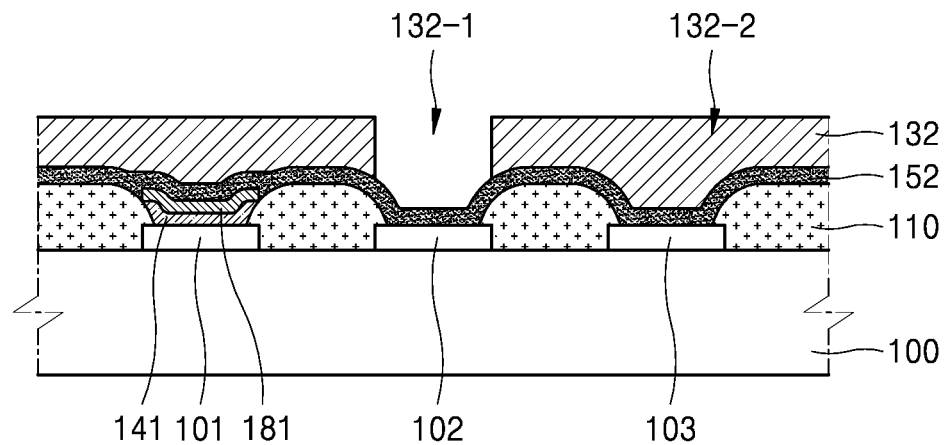

Referring to FIG. 16B, the second photoresist 132 may be developed. In the second photoresist 132 that is developed, a first portion 132-1 corresponding to the second anode 102 may be removed and a second portion 132-2 other than the first portion 132-1 may remain.

Figure 16C:
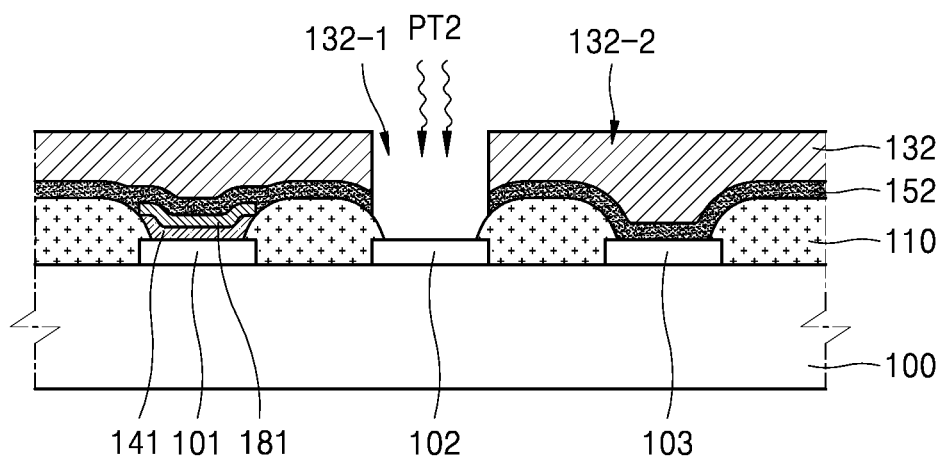

Referring to FIG. 16C, a portion of the second self-assembled monolayer 152 on the second anode 102 may be removed by performing second plasma heat treatment PT2 on a structure illustrated in FIG. 16B. An Si—O bond between the second anode 102 and the second self-assembled monolayer 152 may be cleanly broken by the second plasma heat treatment PT2.

Figure 16D:
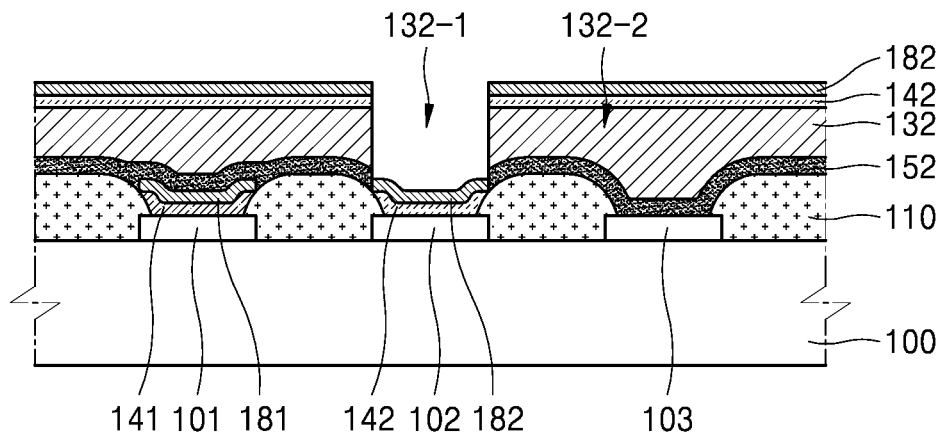

Referring to FIG. 16D, a second organic functional layer 142 including a first emission layer and a second auxiliary cathode 182 may be sequentially formed on the structure illustrated in FIG. 16C. A portion of the second organic functional layer 142 may be formed at a position corresponding to the first portion 132-1, that is, above the second anode 102, and another portion of the second organic functional layer 142 may be formed on the second portion 132-2 of the second photoresist 132. A portion of the second auxiliary cathode 182 may be formed to cover a top surface of the second organic functional layer 142, and another portion of the second auxiliary cathode 182 may be formed on the second organic functional layer 142 on the second portion 132-2 of the second photoresist 132 other than the first portion 132-1.

Figure 16E:
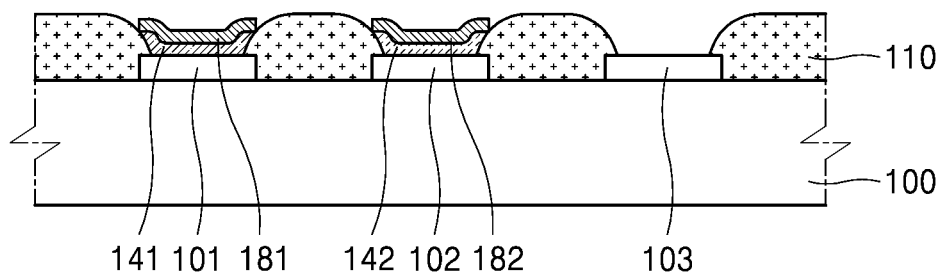
Figure 17A:
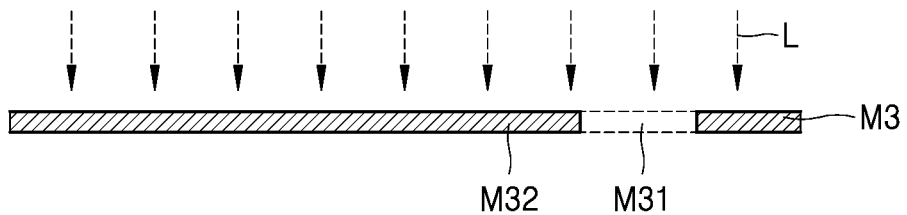
FIGS. 17A to 17E illustrate cross-sectional views for explaining a third unit process of forming the organic light-emitting display apparatus following the second unit process illustrated in FIGS. 16A to 16E according to an embodiment.
Figure 17A:
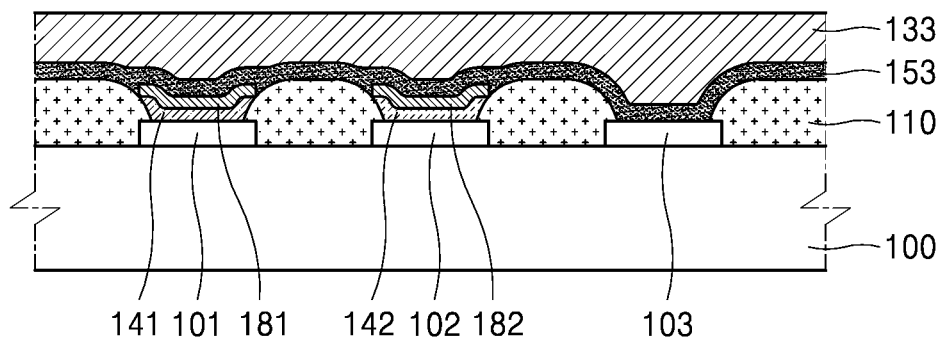
Figure 17B:
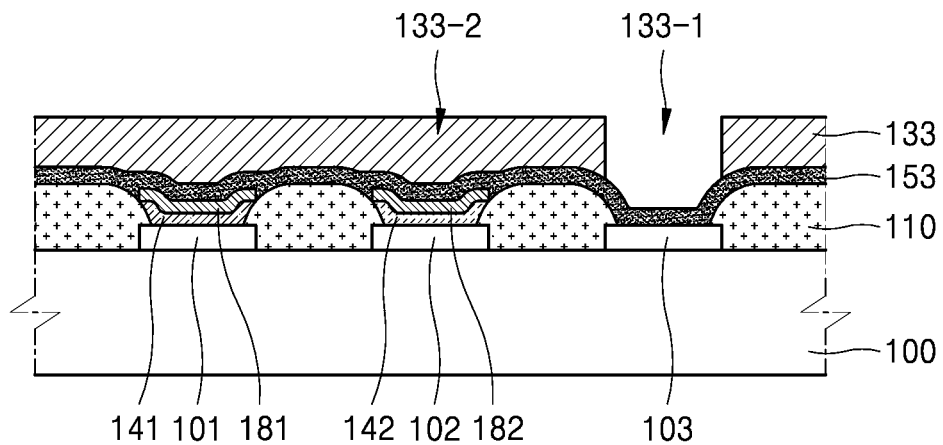
Figure 17C:
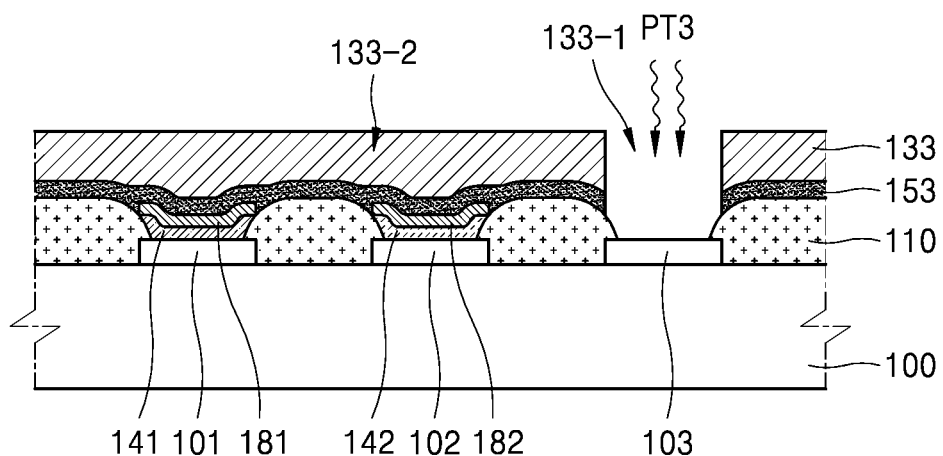
Figure 17D:
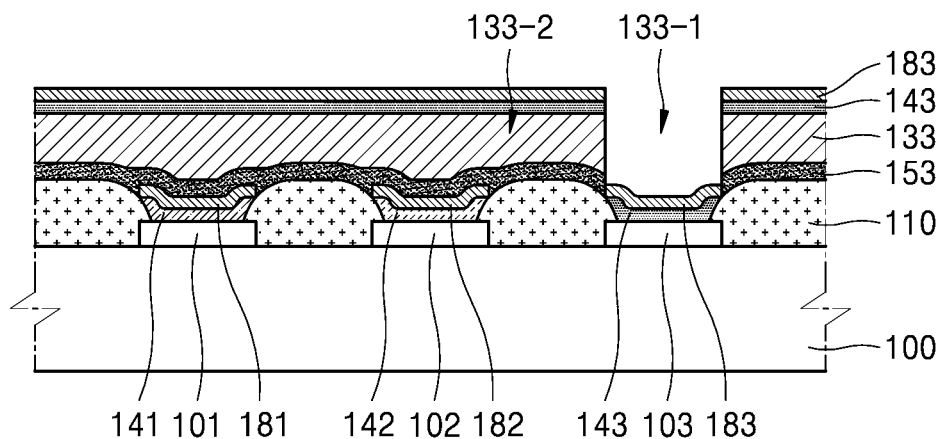
Figure 17E:
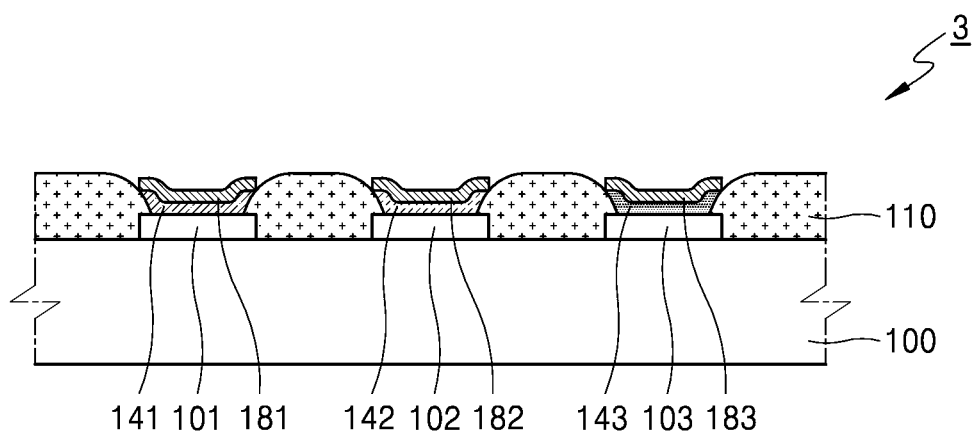

Referring to FIG. 16E, a lift-off process is performed on the structure illustrated in FIG. 16D. When the second photoresist 132 is lifted off, portions of the second organic functional layer 142 and the second auxiliary cathode 182 formed over the second portion 132-2 of the second photoresist 132 may be removed, and portions of the second organic functional layer 142 and the second auxiliary cathode 182 formed over the second anode 102 may remain as patterns. The second self-assembled monolayer 152 located between the pixel-defining layer 110 and the second photoresist 132 may also be removed.

FIGS. 17A to 17E illustrate cross-sectional views for explaining a third unit process of the organic light-emitting display apparatus 3 according to this embodiment.

The third unit process is similar to the second unit process described with reference to FIGS. 16A to 16E, except that a third self-assembled monolayer 153 is formed and finally removed, and thus, a detailed description of the third unit process will not be repeated.

Although not shown in the drawings, the organic light-emitting display apparatuses described above may further include a sealing member for sealing an organic emission layer. The sealing member may include a glass substrate, a metal foil, a thin film encapsulating layer in which an inorganic layer and an organic layer are mixed, or the like.

By way of summation and review, embodiments provide an organic light-emitting display apparatus with increased resolution and reduced defects and cost. Embodiments further provide a method of manufacturing the organic light-emitting display.

According to one or more embodiments as described above, an emission layer is formed without using a fine metal mask (FMM). Accordingly, a high resolution display panel may be formed.

A self-assembled monolayer may be formed between an anode and a lift-off layer. Accordingly, the self-assembled monolayer may prevent a residue of lift-off layer from remaining on the anode. Thus, quality of an organic light-emitting display apparatuses according to the embodiments may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting display apparatus, comprising:
   a substrate;
   a first first electrode on the substrate;
   a first functional layer on the first first electrode, the first functional layer including a first emission layer;
   a first second electrode on the first functional layer;
   a second first electrode on the substrate, the second first electrode being spaced apart from the first first electrode;
   a second functional layer on the second first electrode, the second functional layer including a second emission layer;
   a second second electrode on the second functional layer;
   a pixel-defining layer including an insulating layer and covering an edge of the first first electrode and an edge of the second first electrode; and
   a layer on the pixel-defining layer, the layer containing fluorine and being spaced apart from the first functional layer to expose a portion of a surface of the pixel-defining layer and spaced apart from the second functional layer to expose another portion of the surface of the pixel-defining layer.

2. The organic light-emitting display apparatus as claimed in claim 1, wherein a color of light emitted from the first emission layer is different from a color of light emitted from the second emission layer.

3. The organic light-emitting display apparatus as claimed in claim 1, wherein each of the first functional layer and the second functional layer further includes at least one of a hole injection layer, a hole transport layer, an electron transport layer, and an electron injection layer.

4. The organic light-emitting display apparatus as claimed in claim 1, wherein an edge portion of the first functional layer and an edge portion of the second functional layer are on an inclined surface of the pixel-defining layer.

5. The organic light-emitting display apparatus as claimed in claim 1, wherein the layer surrounds the first functional layer and the second functional layer.

6. The organic light-emitting display apparatus as claimed in claim 5, wherein the layer is spaced apart from end portions of the first functional layer and the second functional layer by a preset gap.

7. The organic light-emitting display apparatus as claimed in claim 1, wherein the layer includes a fluorocarbon group ($-CF_3$).

8. The organic light-emitting display apparatus as claimed in claim 1, wherein the first first electrode and the second first electrode include a conductive oxide.

9. The organic light-emitting display apparatus as claimed in claim 8, wherein the first first electrode and the second first electrode include at least one of indium tin oxide, indium zinc oxide, zinc oxide, indium oxide, indium gallium oxide, and aluminum zinc oxide.

10. The organic light-emitting display apparatus as claimed in claim 1, further comprising a common electrode integrally formed on the first second electrode and the second second electrode.

* * * * *